(12) United States Patent
Seo et al.

(10) Patent No.: US 11,569,478 B2
(45) Date of Patent: Jan. 31, 2023

(54) FLEXIBLE DISPLAY APPARATUS HAVING IMPROVED RELIABILITY

(71) Applicant: SAMSUNG DISPLAY CO., LTD., Yongin-si (KR)

(72) Inventors: Junghan Seo, Hwaseong-si (KR); Woo Yong Sung, Seoul (KR); Seungyong Song, Suwon-si (KR); Hye Yong Chu, Hwaseong-si (KR); Wooyoung Kim, Yongin-si (KR); Kwanhyuck Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 17/102,731

(22) Filed: Nov. 24, 2020

(65) Prior Publication Data

US 2021/0184169 A1    Jun. 17, 2021

(30) Foreign Application Priority Data

Dec. 17, 2019    (KR) .......................... 10-2019-0168973

(51) Int. Cl.
*H01L 51/52*    (2006.01)
*H01L 51/00*    (2006.01)
*H01L 27/32*    (2006.01)

(52) U.S. Cl.
CPC ...... *H01L 51/5253* (2013.01); *H01L 27/3246* (2013.01); *H01L 27/3258* (2013.01);
(Continued)

(58) Field of Classification Search
CPC ............. H01L 51/5253; H01L 27/3246; H01L 27/3258; H01L 27/3262; H01L 51/0097; H01L 51/5209; H01L 51/5225
(Continued)

(56) References Cited

U.S. PATENT DOCUMENTS 10,405,438  B2     9/2019   Lee et al.
2015/0049428 A1*   2/2015   Lee .................... G06F 1/1652
                                                       361/679.27
(Continued)

FOREIGN PATENT DOCUMENTS

KR    10-2018-0011924 A    2/2018
KR    10-2018-0028585 A    3/2018
(Continued)

*Primary Examiner* — Xia L Cross
(74) *Attorney, Agent, or Firm* — Lewis Roca Rothgerber Christie LLP

(57) ABSTRACT

A display apparatus may include: a base substrate including at least one bending region and a non-bending region adjacent to the bending region and having a flexible property; a circuit device layer on the base substrate, the circuit device layer including a thin film transistor; a display device layer on the circuit device layer, the display device layer including an organic light emitting diode connected to the thin film transistor; an encapsulation layer covering the display device layer and including a first inorganic layer, an organic layer, and a second inorganic layer, which are sequentially stacked; and a groove overlapped with the bending region, the groove penetrating the display device layer and the circuit device layer, and at least one of the first inorganic layer and the second inorganic layer covers the groove.

18 Claims, 21 Drawing Sheets

(52) U.S. Cl.
CPC ...... *H01L 27/3262* (2013.01); *H01L 51/0097* (2013.01); *H01L 51/5209* (2013.01); *H01L 51/5225* (2013.01)

(58) Field of Classification Search
USPC .......................................................... 257/40
See application file for complete search history.

(56) References Cited

U.S. PATENT DOCUMENTS

| | | |
|---|---|---|
| 2018/0026225 A1 | 1/2018 | Kwon et al. |
| 2018/0308903 A1* | 10/2018 | Jeong .................. H01L 27/3276 |
| 2019/0157607 A1 | 5/2019 | Kim et al. |

FOREIGN PATENT DOCUMENTS

| | | |
|---|---|---|
| KR | 10-2019-0059708 A | 5/2019 |
| KR | 10-2020-0120804 A | 10/2020 |

* cited by examiner

FLEXIBLE DISPLAY APPARATUS HAVING IMPROVED RELIABILITY

CROSS-REFERENCE TO RELATED APPLICATION

This application claims priority to and the benefit of Korean Patent Application No. 10-2019-0168973, filed on Dec. 17, 2019 in the Korean Intellectual Property Office, the entire content of which is hereby incorporated by reference.

BACKGROUND

1. Field

Aspects of embodiments of the present disclosure relate to a display apparatus.

2. Description of the Related Art

In an information society, display apparatuses are becoming more important as media providing visual information to a user. Examples of the display apparatus include liquid crystal display (LCD) devices, plasma display panel (PDP) devices, organic light emitting display (OLED) devices, field effect display (FED) devices, and electrophoretic display (EPD) devices.

The display apparatus is activated when it is applied with electrical signals. The display apparatus includes a display panel displaying an image and a touch screen sensing an external touch event.

Recently, there is an increasing demand for a flexible display apparatus, which can be bent or folded with a specific curvature.

SUMMARY

According to an aspect of embodiments of the present disclosure, a display apparatus with improved reliability is provided. According to another aspect of embodiments of the present disclosure, a highly-reliable display apparatus that can effectively relieve a mechanical stress caused by a bending operation is provided.

According to one or more embodiments, a display apparatus includes: a base substrate including at least one bending region and a non-bending region adjacent to the bending region and having a flexible property; a circuit device layer on the base substrate, the circuit device layer including a thin film transistor; a display device layer on the circuit device layer, the display device layer including an organic light emitting diode connected to the thin film transistor; an encapsulation layer covering the display device layer and including a first inorganic layer, an organic layer, and a second inorganic layer, which are sequentially stacked; and a groove overlapped with the bending region, the groove penetrating the display device layer and the circuit device layer, and at least one of the first inorganic layer and the second inorganic layer covers the groove.

In an embodiment, the groove may have an under-cut structure.

In an embodiment, the groove may have a structure in which patterns extending in two different direction are alternately arranged.

In an embodiment, the groove may extend to define a curved pattern or a sinusoidal wave pattern in a direction.

In an embodiment, the groove may include a plurality of groove patterns which are spaced apart from each other in a direction, and the circuit device layer and the display device layer may be between the groove patterns.

In an embodiment, the groove may include a plurality of extension patterns which extend in a first direction and are arranged in a direction crossing the first direction, and connection patterns, which are between the extension patterns.

In an embodiment, the groove may include a central pattern which extends in a first direction, and branch patterns which extend from the central pattern in a direction oblique to the first direction and are spaced apart from each other in the first direction.

In an embodiment, the display apparatus may further include another groove which is spaced farther apart from the non-bending region than the groove and penetrates the display device layer and the circuit device layer. The another groove may be sequentially covered with the first inorganic layer and the second inorganic layer.

In an embodiment, the display apparatus may further include a planarization layer which fills the another groove, an inner surface of the another groove being enclosed by the second inorganic layer, and the planarization layer, together with the encapsulation layer, providing a flat surface.

In an embodiment, the display apparatus may further include an auxiliary groove which is spaced farther apart from the non-bending region than the groove and penetrates the display device layer and a portion of the base substrate. The auxiliary groove may be sequentially covered with the first inorganic layer and the second inorganic layer.

According to one or more embodiments, a display apparatus may include: a base substrate including at least one bending region and a non-bending region adjacent to the bending region and having a flexible property; a circuit device layer on the base substrate, the circuit device layer including a thin film transistor, a plurality of insulating layers, and a first hole penetrating the insulating layers overlapped with the bending region; a display device layer on the circuit device layer, the display device layer including a first electrode, a second electrode on the first electrode, an emission pattern between the first and second electrodes, a pixel definition layer including an opening exposing at least a portion of the first electrode, and a second hole overlapped with the first hole to penetrate the pixel definition layer and the first electrode; and an encapsulation layer covering the display device layer, the encapsulation layer including a first inorganic layer, an organic layer, and a second inorganic layer, which are sequentially stacked, and at least one of the first and second inorganic layers covers the first hole and the second hole.

In an embodiment, the second hole may have a minimum width which is smaller than a minimum width of the first hole, and may have an under-cut structure.

In an embodiment, the under-cut structure may have a structure in which patterns extending in two different direction are alternately arranged.

In an embodiment, the under-cut structure may extend to define a curved pattern or a sinusoidal wave pattern in a direction.

In an embodiment, the under-cut structure may include a plurality of patterns which are spaced apart from each other in a direction, and the circuit device layer and the display device layer may be between the patterns.

In an embodiment, the under-cut structure may include a plurality of extension patterns which extend in a first direction and are arranged in a direction crossing the first direction, and connection patterns which are between the extension patterns.

In an embodiment, the under-cut structure may include a central pattern which extends in a first direction, and branch patterns which extend from the central pattern in a direction oblique to the first direction and are spaced apart from each other in the first direction.

In an embodiment, the circuit device layer may further include a third hole which is spaced farther apart from the non-bending region than the first hole and penetrates the plurality of insulating layers. The display device layer may further include a fourth hole which is overlapped with the third hole and penetrates the pixel definition layer and the first electrode. The third hole and the fourth hole may be sequentially covered with the first inorganic layer and the second inorganic layer.

In an embodiment, the fourth hole may have a minimum width which is smaller than a minimum width of the third hole, and may have an under-cut structure.

In an embodiment, the display apparatus may further include an auxiliary hole which is spaced farther apart from the non-bending region than the first hole and the second hole and penetrates the display device layer and a portion of the base substrate. The auxiliary hole may be sequentially covered with the first inorganic layer and the second inorganic layer.

BRIEF DESCRIPTION OF THE DRAWINGS

Embodiments will be more clearly understood from the following description of some example embodiments, taken in conjunction with the accompanying drawings. The accompanying drawings represent some non-limiting, example embodiments as described herein.

Figure 1A:
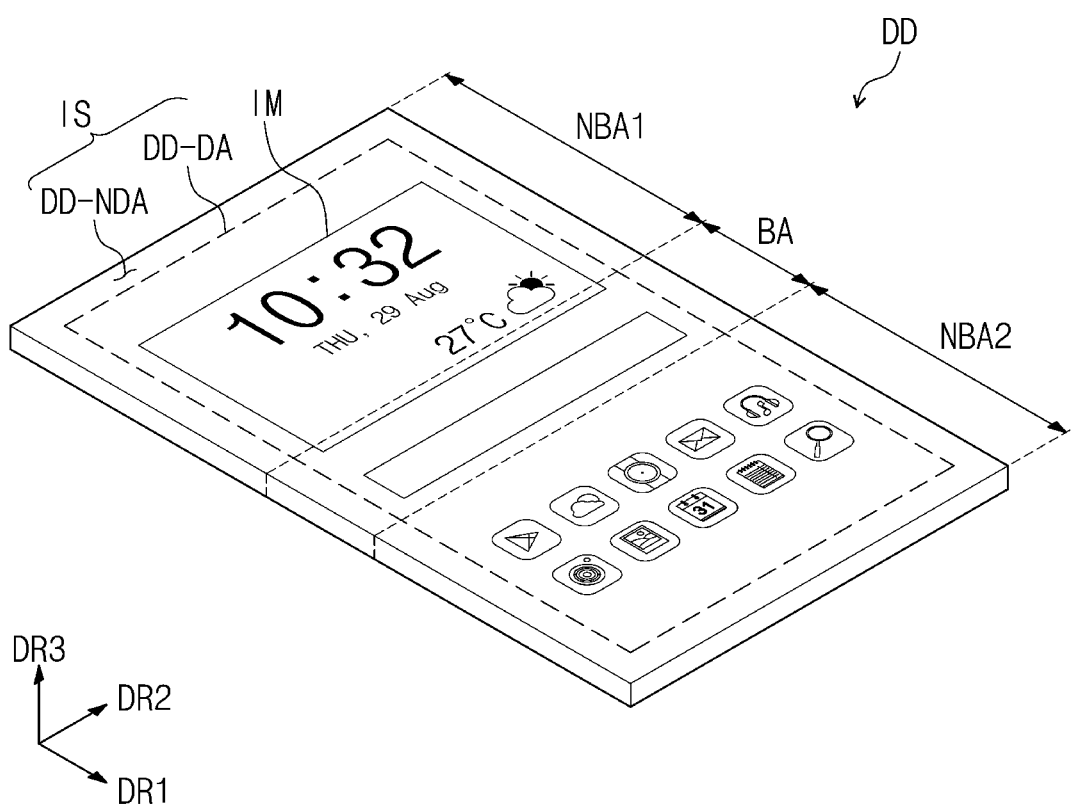
FIG. 1A is a perspective view illustrating a first operation of a display apparatus according to an embodiment of the inventive concept.

These figures are intended to illustrate general characteristics of methods, structures, and/or materials utilized in certain example embodiments and to supplement the written description provided below. These drawings may not, however, be to scale and may not precisely reflect the precise structural or performance characteristics of any given embodiment, and should not be interpreted as defining or limiting the range of values or properties encompassed by example embodiments. For example, the relative thicknesses and positioning of components, layers, regions, and/or structural elements may be reduced or exaggerated for clarity. The use of similar or same reference numbers in the various drawings is intended to indicate the presence of a similar or same element or feature.

DETAILED DESCRIPTION

Some example embodiments of the inventive concepts will now be described more fully with reference to the accompanying drawings, in which some example embodiments are shown. Embodiments of the inventive concepts may, however, be embodied in many different forms and should not be construed as being limited to the embodiments set forth herein; rather, these embodiments are provided so that this disclosure will fully convey the concept of example embodiments to those of ordinary skill in the art. In the drawings, the thicknesses of layers and regions may be exaggerated for clarity. Like reference numerals in the drawings denote like elements, and, thus, their repeated description may be omitted.

It is to be understood that when an element is referred to as being "connected" or "coupled" to another element, it may be directly connected or coupled to the other element or one or more intervening elements may be present. In contrast, when an element is referred to as being "directly connected" or "directly coupled" to another element, there are no intervening elements present. Like reference numerals indicate like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an," and "the" are intended to include the plural forms as well, unless the context clearly indicates otherwise. It is to be further understood that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Some example embodiments of the inventive concepts may be described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not be interpreted in an idealized or overly formal sense unless expressly so defined herein.

Figure 1B:
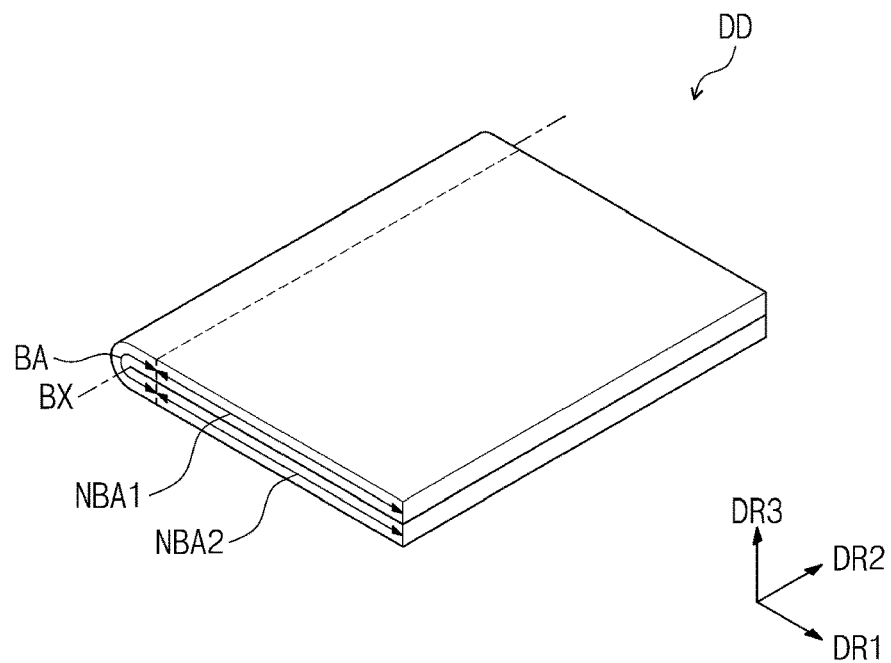
FIG. 1B is a perspective view illustrating a second operation of a display apparatus according to an embodiment of the inventive concept.
Figure 1C:
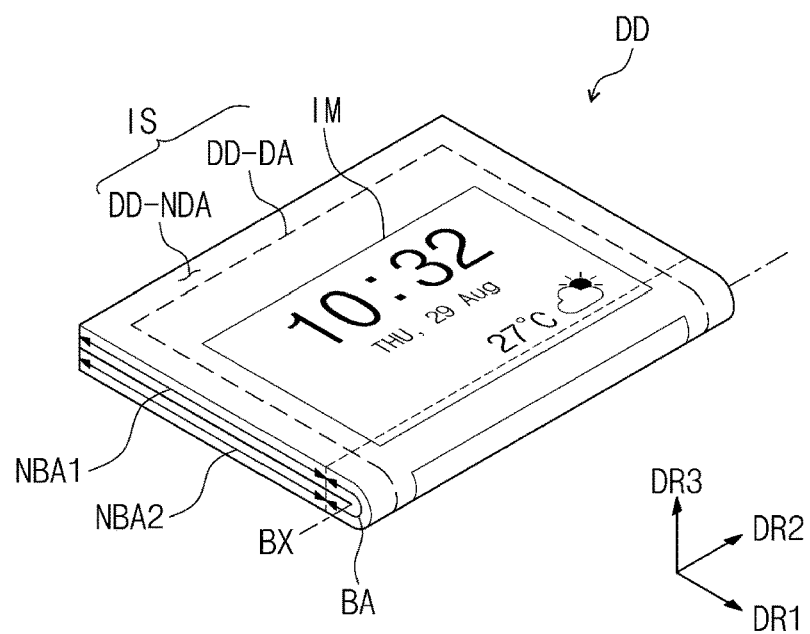
FIG. 1C is a perspective view illustrating a third operation of a display apparatus according to an embodiment of the inventive concept.
Figure 2:
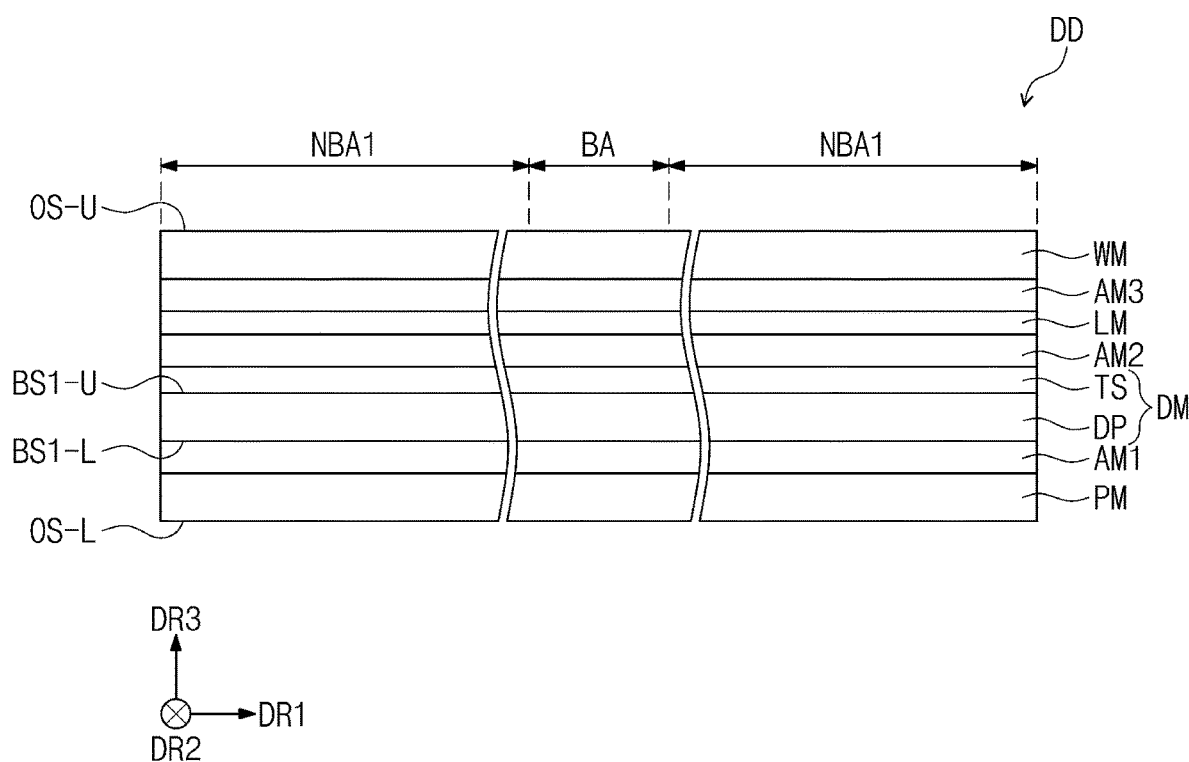
FIG. 2 is a cross-sectional view illustrating a display apparatus according to an embodiment of the inventive concept.

FIG. 1A is a perspective view illustrating a first operation of a display apparatus according to an embodiment of the inventive concept; FIG. 1B is a perspective view illustrating a second operation of a display apparatus according to an embodiment of the inventive concept; FIG. 1C is a perspective view illustrating a third operation of a display apparatus according to an embodiment of the inventive concept; and FIG. 2 is a cross-sectional view illustrating a display apparatus according to an embodiment of the inventive concept.

As shown in FIG. 1A, when a display apparatus DD is in a first operation mode, a display surface IS, which is used to display an image IM, may be parallel to a plane defined by a first direction axis DR1 and a second direction axis DR2. Herein, a third direction axis DR3 will be used to refer to a thickness direction of the display apparatus DD (i.e., a direction normal to the display surface IS). A front or top surface and a rear or bottom surface of each member may be distinguished, based on the third direction axis DR3. However, directions indicated by the first to third direction axes DR1, DR2, and DR3 may be relative concepts, and, in certain embodiments, they may be changed to indicate other directions. Herein, first to third directions may be directions indicated by the first to third direction axes DR1, DR2, and DR3, respectively, and will be identified with the same reference numbers.

FIGS. 1A to 1C illustrate an example in which the display apparatus DD is a foldable display apparatus, one of a flexible display apparatus. However, the inventive concept is not limited to this example, and, in an embodiment, the display apparatus DD may be a rollable or bendable display apparatus. Further, although a flexible display apparatus is described herein, the inventive concept is not limited to this example. For example, the display apparatus DD may be provided in the form of a flat rigid display apparatus. In an embodiment, the flexible display apparatus DD may be used for large-sized electronic devices (e.g., television sets and monitors) or small- or medium-sized electronic devices (e.g., mobile phones, tablets, car navigation systems, game machines, and smart watches).

As shown in FIG. 1A, the display surface IS of the flexible display apparatus DD may include a plurality of regions. For example, the flexible display apparatus DD may include a display region DD-DA displaying the image IM and a non-display region DD-NDA adjacent to the display region DD-DA. The non-display region DD-NDA may not be used to display an image. FIG. 1A illustrates a clock window as an example of the image IM. In an embodiment, the display region DD-DA may have a rectangular shape. In an embodiment, the non-display region DD-NDA may be provided to enclose the display region DD-DA. However, the inventive concept is not limited to this example, and the shapes of the display and non-display regions DD-DA and DD-NDA may be variously changed.

As shown in FIGS. 1A to 1C, the display apparatus DD may include a plurality of regions, which are defined based on an operation mode. The display apparatus DD may include a bending region BA, which can be bent along a bending axis BX parallel to the second direction DR2, and a first non-bending region NBA1 and a second non-bending region NBA2, which are not bent. As shown in FIG. 1B, the display apparatus DD may be configured to perform an inner-bending operation, in which the display surface IS of the first non-bending region NBA1 is placed to face the display surface IS of the second non-bending region NBA2. As shown in FIG. 1C, the display apparatus DD may also be configured to perform an outer-bending operation, in which the display surface IS is exposed to the outside.

FIGS. 1A to 1C illustrate an example, in which the display apparatus DD has a single bending region BA, but the inventive concept is not limited to this example. For example, in an embodiment, the display apparatus DD may include a plurality of bending regions BA. In an embodiment, the display apparatus DD may be configured to repeat only the operation modes shown in FIGS. 1A and 1B. However, the inventive concept is not limited to this example, and the bending region BA may be defined, based on a shape of the display apparatus DD manipulated by a user. For example, the bending region BA may be defined to be extended in the first direction DR1 or in a diagonal direction that is not parallel to both of the first and second directions DR1 and DR2, unlike FIGS. 1B and 1C. An area of the bending region BA may not be fixed and may be changed depending on its curvature radius.

FIG. 2 illustrates a cross-section of the display apparatus DD that is taken to be parallel to both of the second and third directions DR2 and DR3.

As shown in FIG. 2, the display apparatus DD may include a protection film PM, a display module DM, an optical member LM, a window WM, a first adhesive member AM1, a second adhesive member AM2, and a third adhesive member AM3. The display module DM may be disposed between the protection film PM and the optical member LM. The optical member LM may be disposed between the display module DM and the window WM. The first adhesive member AM1 may be used to combine the display module DM to the protection film PM, the second adhesive member AM2 may be used to combine the display module DM to the optical member LM, and the third adhesive member AM3 may be used to combine the optical member LM to the window WM. In an embodiment, at least one of the first adhesive member AM1, the second adhesive member AM2, and the third adhesive member AM3 may be omitted.

The protection film PM may protect the display module DM. The protection film PM may have a first outer surface OS-L, which is exposed to the outside, and an attachment surface, to which the first adhesive member AM1 is attached. The protection film PM may prevent or substantially prevent outer moisture from entering the display module DM and may absorb an external impact from the outside.

In an embodiment, the protection film PM may include a plastic film serving as a base layer. The protection film PM may include a plastic film containing one selected from the group consisting of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), poly(arylene ether sulfone), and a combination thereof.

However, materials for the protection film PM are not limited to plastic resins, and, in an embodiment, organic/inorganic composites may be used for the protection film PM. In an embodiment, the protection film PM may include a porous organic layer with pores and an inorganic material filling the pores of the organic layer. The protection film PM may further include a functional layer formed on the plastic film. The functional layer may include a resin layer. In an embodiment, the functional layer may be formed by a coating method. In an embodiment, the protection film PM may be omitted.

The window WM may protect the display module DM from an external impact and may provide an input surface to a user. The window WM may have a second outer surface OS-U, which is exposed to the outside, and an attachment surface, to which the third adhesive member AM3 is attached. In an embodiment, the display surface IS shown in FIGS. 1A and 1C may be the second outer surface OS-U.

In an embodiment, the window WM may include a plastic film. In an embodiment, the window WM may have a multi-layered structure. For example, the window WM may have a multi-layered structure including at least one of a glass substrate, a plastic film, and a plastic substrate. The window WM may further include a bezel pattern. The multi-layered structure may be formed by a successive process or by an adhesion process using an adhesive layer.

The optical member LM may reduce optical reflectance of light that is incident from the outside. In an embodiment, the optical member LM may include at least one polarization film. In an embodiment, the optical member LM may further include a phase difference film. In certain embodiments, the optical member LM may be omitted.

The display module DM may include a display panel DP and a sensing sensor TS. In an embodiment, the sensing sensor TS may be directly disposed on the display panel DP. In the present specification, the expression "be directly disposed on" is used to represent that one layer is successively formed on another layer, without an additional adhesive layer interposed therebetween.

The description that follows will refer to an example in which an organic light emitting display panel is used as the display panel DP, but the inventive concept is not limited to this example. For example, the display panel DP may be one of a liquid crystal display panel, a plasma display panel, an electrophoretic display panel, a microelectromechanical system (MEMS) display panel, and an electrowetting display panel.

The organic light emitting display panel DP may generate an image IM (see, e.g., FIG. 1A), based on image data input thereto. The organic light emitting display panel DP may have a first display surface BS1-L and a second display surface BS1-U, which are opposite to each other in the thickness direction or the third direction DR3.

The sensing sensor TS may obtain coordinate information of an external input. The sensing sensor TS may sense an external input (e.g., in a capacitance sensing manner). The external input may include any of various types of input signals, which are provided from the outside of the display apparatus DD. The external input may be provided to the sensing sensor TS in any of various forms. For example, the sensing sensor TS may be configured to sense a touching-type external input, such as a user's body or hand, and a non-touching-type external input, such as a reduction in distance from the display apparatus DD or a hovering event near the display apparatus DD. In addition, the sensing sensor TS may be configured to sense a change in physical characteristics (e.g., force, pressure, or light intensity) of an external input, but the inventive concept is not limited to a specific embodiment.

Although not shown, in an embodiment, the display module DM may further include an anti-reflection layer. The anti-reflection layer may include a color filter or a stack of a conductive layer/an insulating layer/a conductive layer. The anti-reflection layer may absorb light, which is incident from the outside, or may reduce optical reflectance of the incident light using the destructive interference or polarization phenomena. In certain embodiments, the anti-reflection layer may replace the optical member LM.

In an embodiment, each of the first adhesive member AM1, the second adhesive member AM2, and the third adhesive member AM3 may be formed of or include an organic adhesive layer (e.g., an optically clear adhesive (OCA) film, an optically clear resin (OCR) film, or a pressure sensitive adhesive (PSA) film). The organic adhesive layer may include an adhesive material, such as any of polyurethane, polyacryl, polyester, polyepoxy, and polyvinyl acetate materials.

Although not shown, the display apparatus DD may further include a frame structure, which is used to support the functional layers and thereby maintain the operation modes or shapes illustrated in FIGS. 1A to 1C. The frame structure may include a joint structure or a hinge structure.

Figure 3A:
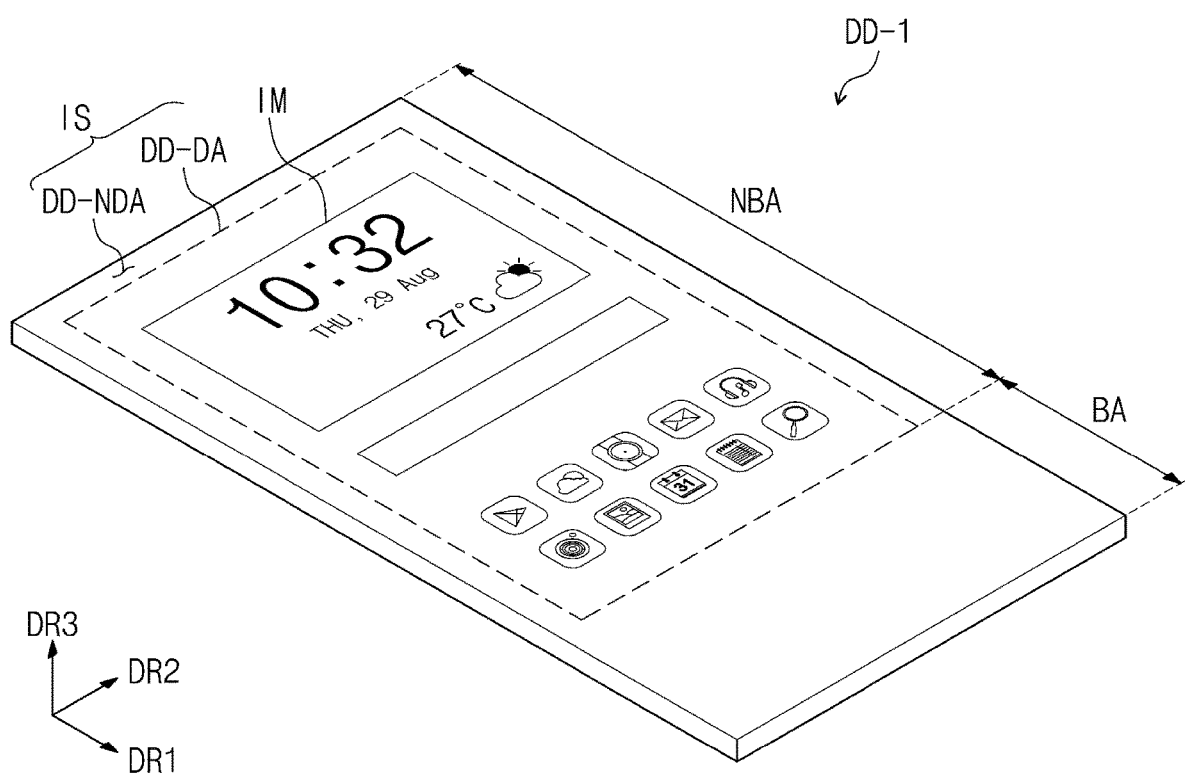
FIGS. 3A and 3B are perspective views illustrating a display apparatus according to an embodiment of the inventive concept.
Figure 3B:
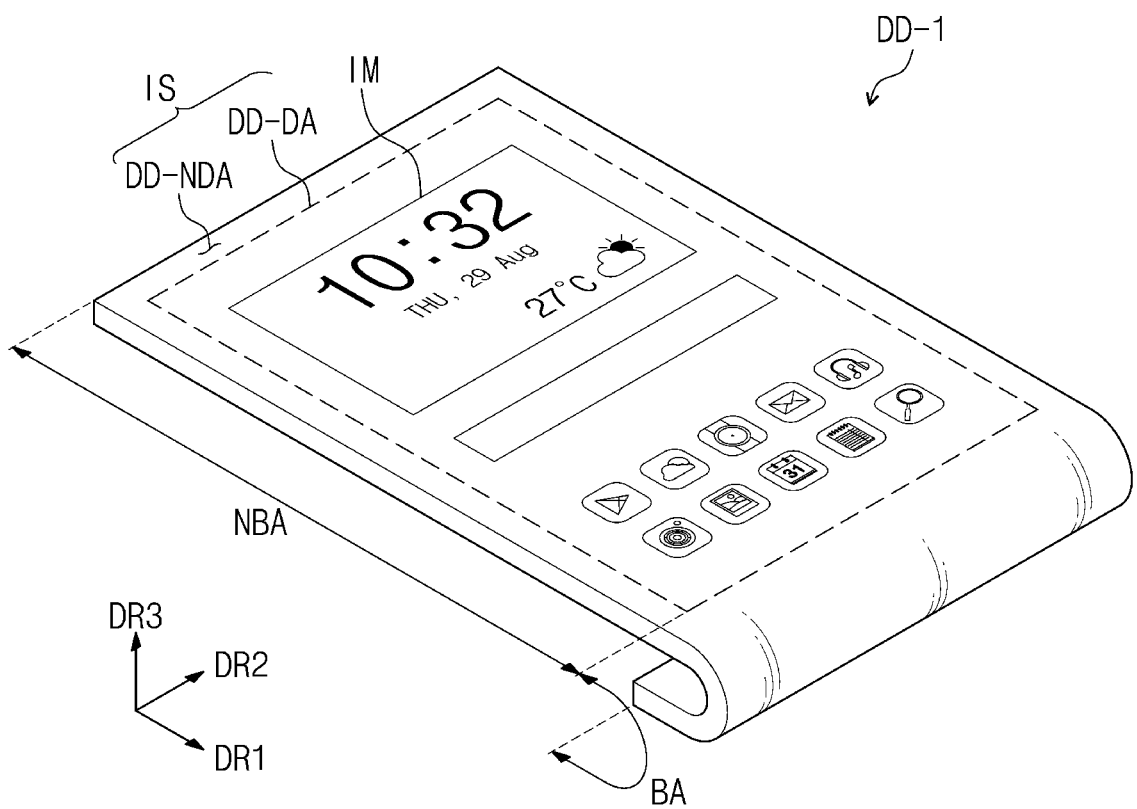

FIGS. 3A and 3B are perspective views illustrating a display apparatus DD-1 according to an embodiment of the inventive concept. FIG. 3A illustrates the display apparatus DD-1 that is in an unfolded state; and FIG. 3B illustrates the display apparatus DD-1 that is in a bent state.

The display apparatus DD-1 may include one bending region BA and one non-bending region NBA. In the present embodiment, the non-display region DD-NDA of the display apparatus DD-1 may be bent. However, the inventive concept is not limited to this example, and, in an embodiment, the bending region BA of the display apparatus DD-1 may be changed.

The display apparatus DD-1 according to the present embodiment may operate in a fixed shape, unlike the display apparatus DD of FIGS. 1A to 1C. The display apparatus DD-1 may operate in a bent state, as shown in FIG. 3B. The display apparatus DD-1 in the bent state may be fastened to a frame, and the frame with the display apparatus DD-1 may be combined to a housing of an electronic device.

The display apparatus DD-1 according to the present embodiment may have the same cross-sectional structure as that shown in FIG. 2. However, the non-bending region NBA and the bending region BA may have different stacking structures from each other. The non-bending region NBA may have the same cross-sectional structure as that in FIG. 2, and the bending region BA may have a cross-sectional structure different from that in FIG. 2.

Figure 4:
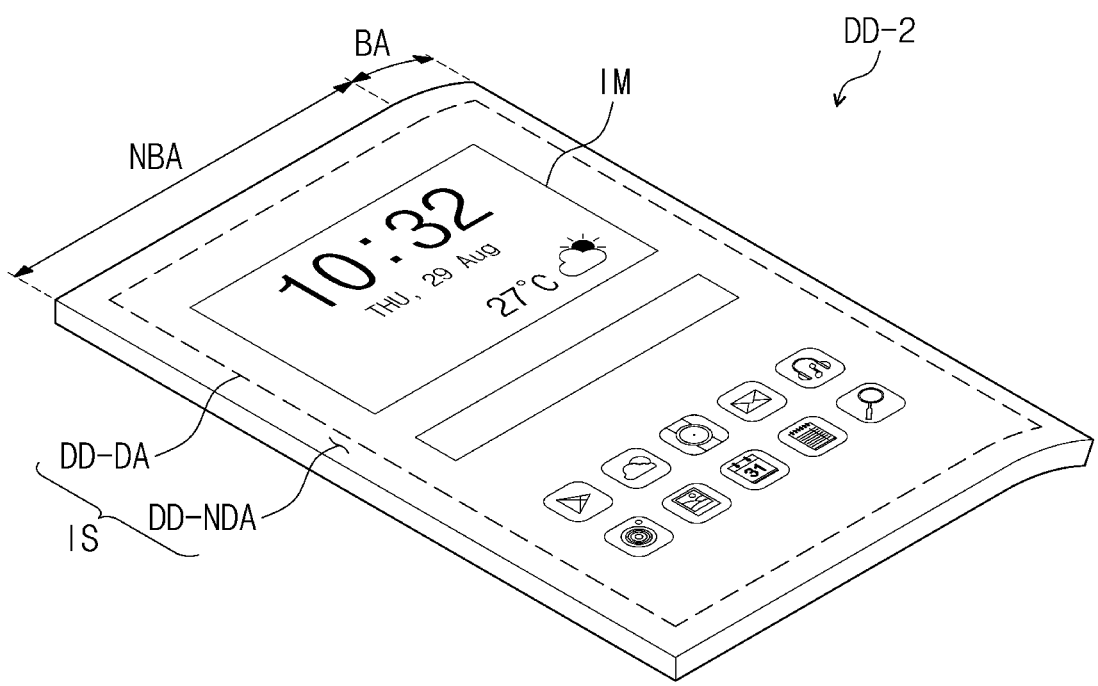
FIG. 4 is a perspective view illustrating a display apparatus according to an embodiment of the inventive concept.
Figure 4:
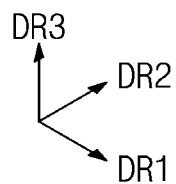

FIG. 4 is a perspective view illustrating a display apparatus DD-2 according to an embodiment of the inventive concept.

The display apparatus DD-2 may include a non-bending or flat region NBA, which is used to display a main image in a forward direction, and a bending or side region BA, which is used to display an auxiliary image in a lateral direction. Although not shown, the auxiliary image may include an icon image, which provides information on the meaning of a relevant application to a user, for example. In the present embodiment, the bending and non-bending regions BA and NBA may be defined as two different regions of the display apparatus DD-2 that are differentiated based on a shape of the display apparatus DD-2.

In the present embodiment, the display apparatus DD-2 is illustrated to include one bending region BA, which is bent along one of edge portions of the non-bending region NBA. However, in an embodiment, the display apparatus DD-2 may include a pair of bending regions, which are bent along two opposite edge portions of the non-bending region NBA.

The bending region BA, which is bent from the non-bending region NBA, may display the auxiliary image in a direction that is not parallel to any of the first, second, and third directions DR1, DR2, and DR3.

Figure 5A:
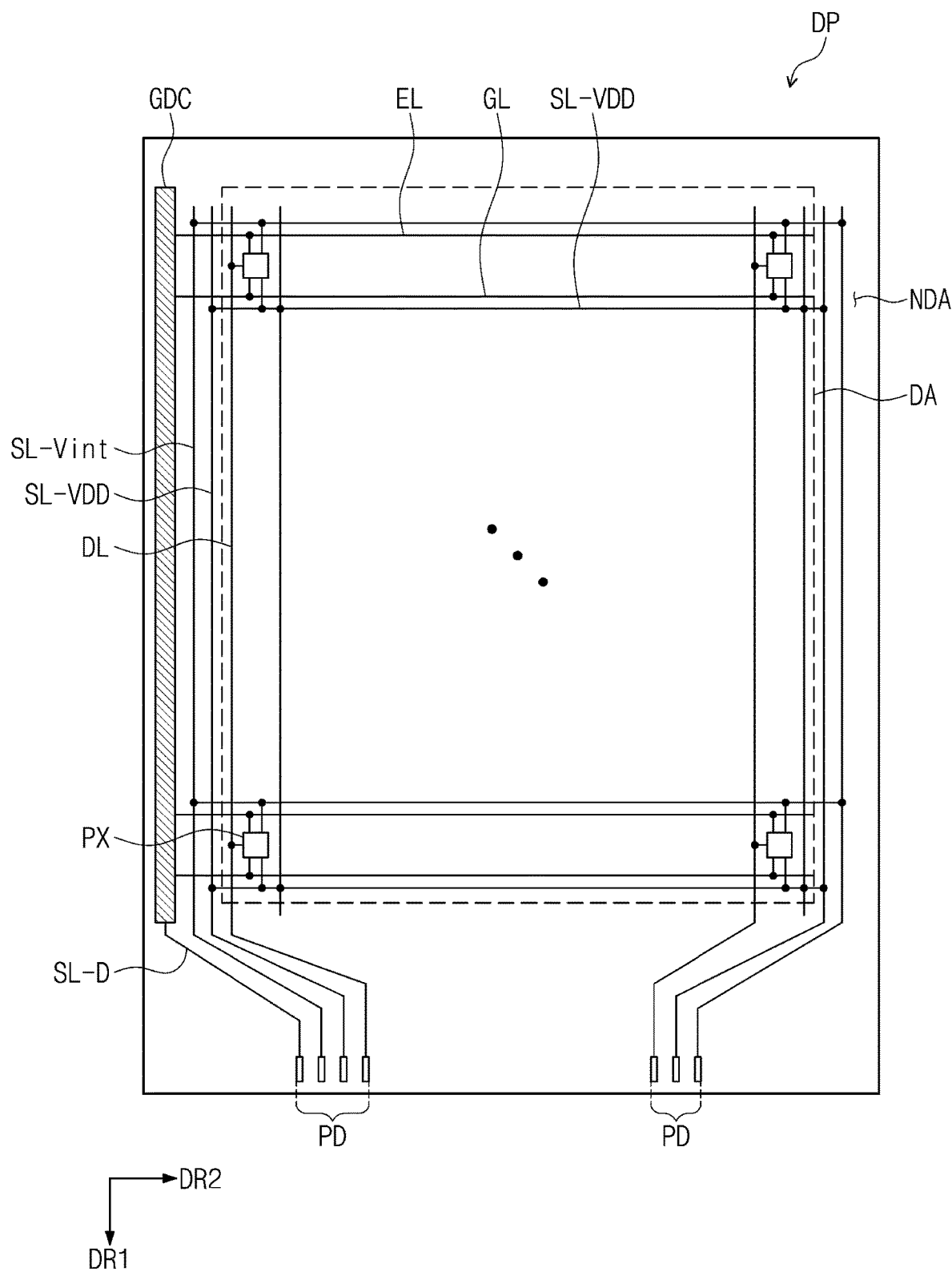
FIG. 5A is a plan view illustrating a display panel of a display apparatus according to an embodiment of the inventive concept.
Figure 5B:
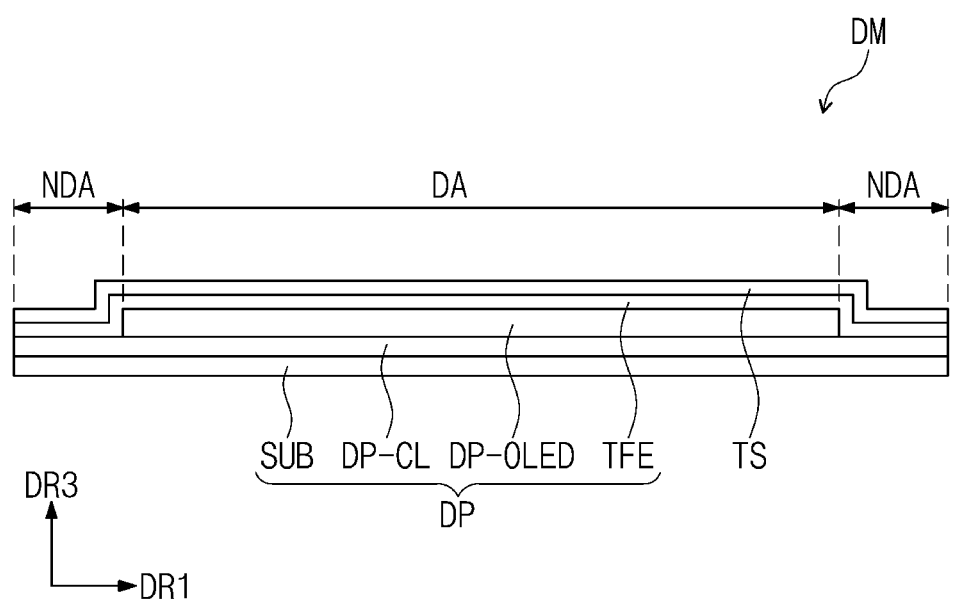
FIG. 5B is a cross-sectional view illustrating a display module of a display apparatus according to an embodiment of the inventive concept.

FIG. 5A is a plan view illustrating the organic light emitting display panel DP, which is included in a display apparatus according to an embodiment of the inventive concept; and FIG. 5B is a cross-sectional view illustrating the display module DM, which is included in a display apparatus according to an embodiment of the inventive concept.

As shown in FIG. 5A, the organic light emitting display panel DP may include a display region DA and a non-display region NDA, when viewed in a plan view. The display and non-display regions DA and NDA of the organic light emitting display panel DP may correspond to the display and non-display regions DD-DA and DD-NDA, respectively, of the display apparatus DD (see, e.g., FIG. 1A). The structures of the display and non-display regions DA and NDA of the organic light emitting display panel DP may not be the same as those of the display and non-display regions DD-DA and DD-NDA of the display apparatus DD (see, e.g., FIG. 1A) and may be changed depending on the structure or design of the organic light emitting display panel DP.

The organic light emitting display panel DP may include a plurality of pixels PX. A region to which light from the pixels PX is provided may be defined as the display region DA. In the present embodiment, the non-display region NDA may be defined along a border of the display region DA.

The organic light emitting display panel DP may include gate lines GL, data lines DL, emission lines EL, a control signal line SL-D, an initializing voltage line SL-Vint, a voltage line SL-VDD, and a pad portion PD.

Each of the gate lines GL may be connected to corresponding ones of the pixels PX, and each of the data lines DL may be connected to corresponding ones of the pixels PX. Each of the emission lines EL may be arranged parallel to a corresponding one of the gate lines GL. The control signal line SL-D may provide control signals to a gate driving circuit GDC. The initializing voltage line SL-Vint may provide an initializing voltage to the pixels PX. The voltage line SL-VDD may be connected to a plurality of the pixels PX to provide a first voltage to the pixels PX. The voltage line SL-VDD may include a plurality of lines extending in the first direction DR1 and a plurality of lines extending in the second direction DR2.

In an embodiment, some of the gate lines GL, the data lines DL, the emission lines EL, the control signal line SL-D, the initializing voltage line SL-Vint, and the voltage line SL-VDD may be disposed on the same layer, and the others may be disposed on another layer.

The pad portion PD may be connected to an end of each of the data lines DL, the control signal line SL-D, the initializing voltage line SL-Vint, and the voltage line SL-VDD.

As shown in FIG. 5B, the organic light emitting display panel DP may include a base layer or base substrate SUB, a circuit device layer DP-CL disposed on the base layer SUB, a display device layer DP-OLED disposed on the circuit device layer DP-CL, and a thin encapsulation layer, or thin film encapsulation layer, TFE disposed on the display device layer DP-OLED.

In an embodiment, the base layer SUB may include at least one plastic film. The base layer SUB may be a flexible substrate and may include at least one of a plastic substrate, a glass substrate, a metal substrate, or a substrate made of an organic/inorganic composite material. In an embodiment, the plastic substrate may include at least one of acrylic resins, methacryl resins, polyisoprene resins, vinyl resins, epoxy resins, urethane resins, cellulose resins, siloxane resins, polyimide resins, polyamide resins, or perylene resins.

The circuit device layer DP-CL may include a plurality of insulating layers, a plurality of conductive layers, and at least one semiconductor layer. The conductive layers of the circuit device layer DP-CL may be used to constitute signal lines or a control circuit of a pixel.

The display device layer DP-OLED may include organic light emitting diodes, which are connected to at least one of the conductive layers in the circuit device layer DP-CL.

In an embodiment, the thin encapsulation layer TFE may hermetically seal or encapsulate the display device layer DP-OLED. In an embodiment, the thin encapsulation layer TFE may include at least two inorganic layers and at least one organic layer provided therebetween. The inorganic layers may protect the display device layer DP-OLED from moisture or oxygen, and the organic layer may protect the display device layer DP-OLED from a contamination material (e.g., dust particles).

In an embodiment, the sensing sensor TS may be directly disposed on the thin encapsulation layer TFE. The sensing sensor TS may include conductive patterns and sensing signal lines. The conductive patterns and the sensing signal lines may have a single- or multi-layered structure.

In an embodiment, the conductive patterns and the sensing signal lines may be formed of or include at least one of indium tin oxide (ITO), indium zinc oxide (IZO), zinc oxide (ZnO), indium tin zinc oxide (ITZO), PEDOT, metal nano wire, or graphene. In an embodiment, the conductive patterns and the sensing signal lines may include at least one of metallic materials (e.g., molybdenum, silver, titanium, copper, aluminum, or alloys thereof). The conductive patterns and the sensing signal lines may have a same layer structure or different layer structures from each other.

Figure 6:
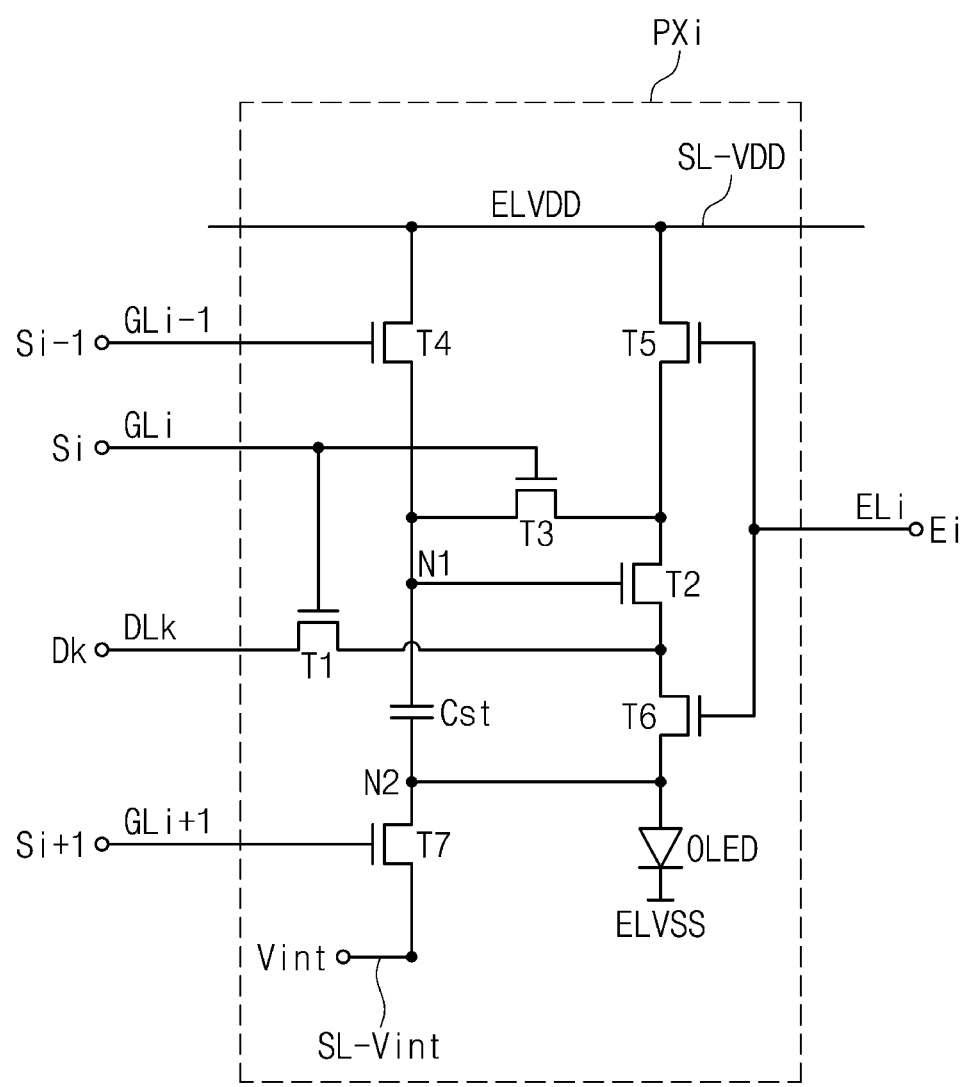
FIG. 6 is an equivalent circuit diagram illustrating a pixel of a display apparatus according to an embodiment of the inventive concept.

FIG. 6 is an equivalent circuit diagram illustrating the pixel PX, which is included in a display apparatus according to an embodiment of the inventive concept.

In FIG. 6, an i-th pixel PXi is illustrated as an example of the pixels PX. Here, as shown in FIG. 6, the i-th pixel PXi may be connected to a k-th data line DLk, which is one of the data lines DL.

The i-th pixel PXi may include an organic light emitting diode OLED and a pixel driving circuit, which is used to control the organic light emitting diode OLED. In an embodiment, the driving circuit may include first to seventh thin-film transistors T1 to T7 and a storage capacitor Cst. An example in which the first to seventh transistors T1 to T7 are n-type thin film transistors will be described below, but the inventive concept is not limited to this example.

A driving transistor may control a driving current to be supplied to the organic light emitting diode OLED. In an embodiment, the driving transistor may be a second transistor T2. An output electrode of the second transistor T2 may be electrically connected to the organic light emitting diode OLED. The output electrode of the second transistor T2 may be in direct contact with a first electrode or anode of the organic light emitting diode OLED or may be connected to the anode via another transistor.

A control transistor may be configured to receive a control signal thorough a control electrode thereof. The control signal applied to the i-th pixel PXi may include an (i−1)-th gate signal Si−1, an i-th gate signal (Si), an (i+1)-th gate signal Si+1, a data signal Dk, and an i-th light-emitting control signal Ei. In some embodiments, the control transistor may include the first and third to seventh transistors T1 and T3 to T7.

A node between an output electrode of the fourth transistor T4 and a control electrode of the second transistor T2 may be defined as a first node N1, and a node between the seventh transistor T7 and the storage capacitor Cst may be defined as a second node N2.

The second transistor T2 may include an input electrode, which receives a first voltage ELVDD through the fifth transistor T5, a control electrode coupled to the first node N1, and an output electrode. The output electrode of the second transistor T2 may provide the first voltage ELVDD to the organic light emitting diode OLED through the sixth transistor T6. The input electrode of the second transistor T2 may be coupled to the first node N1 through the third transistor T3. The second transistor T2 may control a driving current to be supplied to the organic light emitting diode OLED, based on an electric potential of the first node N1.

The first transistor T1 may include an input electrode coupled to the k-th data line DLk, a control electrode coupled to an i-th gate line GLi, and an output electrode coupled to the output electrode of the second transistor T2. The first transistor T1 may be turned-on by a gate signal Si (herein, an i-th gate signal) applied to the i-th gate line GLi, and, in this case, a data signal Dk, which is applied to the k-th data line DLk, may be provided to the storage capacitor Cst. The first transistor T1 may be referred to as a switching transistor.

The third transistor T3 may include an input electrode coupled to the input electrode of the second transistor T2, a control electrode coupled to the i-th gate line GLi, and an output electrode coupled to the first node N1. The third transistor T3 may be turned on in response to the i-th gate signal Si.

In the case in which the first and third transistors T1 and T3 are turned on, the second transistor T2 may be used as a diode-like element between the first and third transistors T1 and T3. In this case, the first transistor T1 may be coupled to the first node N1 through the second transistor T2 and the third transistor T3.

The storage capacitor Cst may be provided between and coupled to the first node N1 and the first electrode of the organic light emitting diode OLED. The storage capacitor Cst may be charged to a voltage level corresponding to a voltage applied to the first node N1.

The fourth transistor T4 may include an input electrode coupled to the voltage line SL-VDD, a control electrode receiving the (i−1)-th gate signal Si−1, and an output electrode coupled to the first node N1. A switching operation of the fourth transistor T4 may be controlled in response to the (i−1)-th gate signal Si−1. The control electrode of the fourth transistor T4 may be coupled to an (i−1)-th gate line GLi−1. A signal line, to which the (i−1)-th gate signal Si−1 is applied, may be changed to a dummy signal line or the like.

The fifth transistor T5 may include an input electrode coupled to the voltage line SL-VDD, a control electrode coupled to an i-th emission line ELi, and an output electrode coupled to the input electrode of the second transistor T2. A switching operation of the fifth transistor T5 may be controlled in response to the i-th light-emitting control signal Ei.

The sixth transistor T6 may include an input electrode coupled to the output electrode of the second transistor T2, a control electrode coupled to the i-th emission line ELi, and an output electrode coupled to the first electrode of the organic light emitting diode OLED. A switching operation of the sixth transistor T6 may be controlled in response to the i-th light-emitting control signal Ei provided through the i-th emission line ELi.

The switching operations of the fifth and sixth transistors T5 and T6 may be controlled to selectively establish a current path between the voltage line SL-VDD and the organic light emitting diode OLED. In certain embodiments, one of the fifth and sixth transistors T5 and T6 may be omitted.

The seventh transistor T7 may include an input electrode coupled to the initializing voltage line SL-Vint, a control electrode receiving the (i+1)-th gate signal Si+1, and an output electrode coupled to the first electrode of the organic light emitting diode OLED. The control electrode of the seventh transistor T7 may be coupled to an (i+1)-th gate line GLi+1. A signal line, to which the (i+1)-th gate signal Si+1 is applied, may be changed to a dummy signal line or the like.

If the fourth transistor T4 is turned on, the first node N1 may be reset by the first voltage ELVDD. If the seventh transistor T7 is turned on, the second node N2 may be initialized by the initialization voltage Vint. The first electrode of the organic light emitting diode OLED may be initialized by the initializing voltage Vint when the seventh transistor T7 is turned on. A potential difference between a second voltage ELVSS, which is applied to the second electrode or cathode of the organic light emitting diode OLED, and the initialization voltage Vint may be lower than a light-emitting threshold voltage of the organic light emitting diode OLED.

Figure 7A:
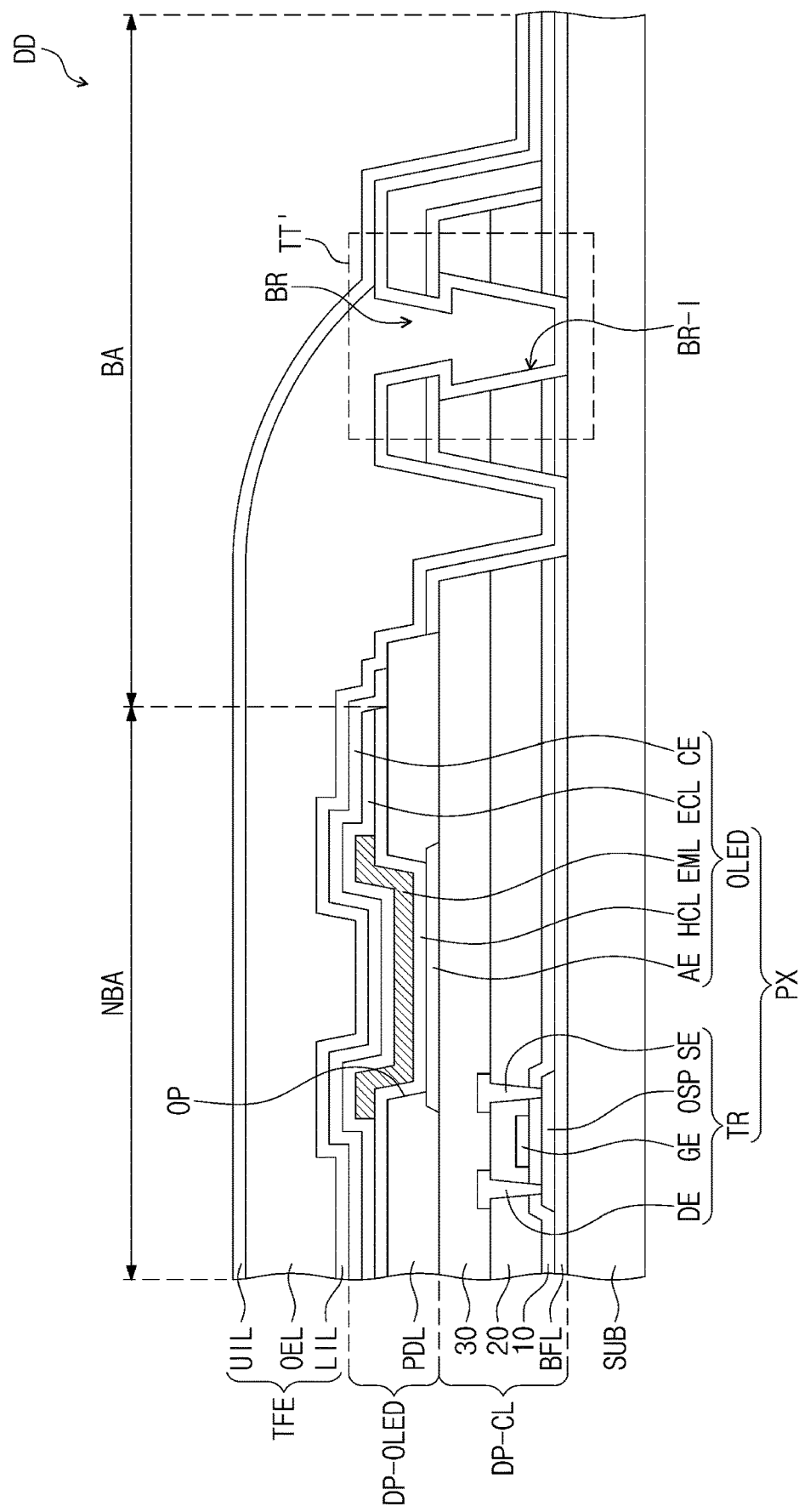
FIG. 7A is a cross-sectional view illustrating a display apparatus according to an embodiment of the inventive concept.
Figure 7B:
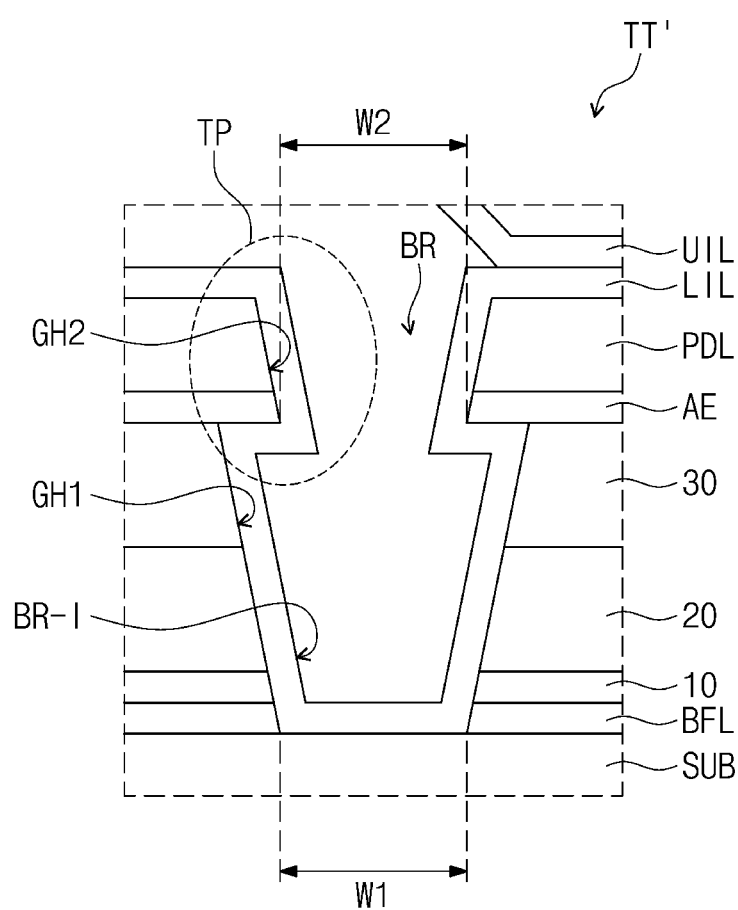
FIG. 7B is an enlarged cross-sectional view of a region TT' of FIG. 7A.

FIG. 7A is a cross-sectional view illustrating a display apparatus according to an embodiment of the inventive concept; and FIG. 7B is an enlarged cross-sectional view of a region TT' of FIG. 7A. FIGS. 8A to 8E are plan views illustrating a groove according to some embodiments of the inventive concept. For concise description, an element previously described with reference to FIGS. 1 to 6 may be identified by the same reference numeral without repeating an overlapping description thereof. In an embodiment, a transistor TR of FIG. 7A may be configured to have substantially the same structure as the sixth transistor T6 of FIG. 6.

The base substrate SUB may include a plurality of regions corresponding to the bending and non-bending regions described with reference to FIGS. 1A to 4. For example, the base substrate SUB may include a bending region BA and a non-bending region NBA. FIG. 7A illustrates an example in which an emission pattern EML of the pixel PX is disposed on the non-bending region NBA and is spaced apart from the bending region BA, but the inventive concept is not limited to this example. For example, the emission pattern EML may be partially provided on the bending region BA, and, in this case, the bending region BA may also be used to display the image IM.

The base substrate SUB may include a plastic substrate, a glass substrate, a metal substrate, etc. In an embodiment, the plastic substrate may include at least one of acrylic resins, methacryl resins, polyisoprene resins, vinyl resins, epoxy resins, urethane resins, cellulose resins, siloxane resins, polyimide resins, polyamide resins, or perylene resins.

A buffer layer BFL may be disposed on the base substrate SUB. A semiconductor pattern OSP may be disposed on the buffer layer BFL. In an embodiment, the buffer layer BFL may be formed of or include an inorganic material. Thus, the buffer layer BFL may prevent or substantially prevent oxygen or moisture, which may pass through the base substrate SUB, from entering the pixel PX. In addition, the buffer layer BFL may lower a surface energy of the base substrate SUB, and, in this case, elements of the pixel PX may be stably formed on the base substrate SUB.

The transistor TR may be placed on the buffer layer BFL. The transistor TR may include the semiconductor pattern OSP, a control electrode GE, an input electrode DE, and an output electrode SE. The semiconductor pattern OSP may be disposed on the buffer layer BFL. The semiconductor pattern OSP may be formed of or include a semiconductor material. For example, the semiconductor pattern OSP may be formed of or include indium-tin oxide (ITO), indium-gallium-zinc oxide (IGZO), zinc oxide (ZnO), or indium-zinc oxide (IZnO).

The control electrode GE may be spaced apart from the semiconductor pattern OSP with a first insulating layer 10 interposed therebetween.

The input electrode DE and the output electrode SE may be provided to penetrate the first insulating layer 10 and a second insulating layer 20 and may be respectively coupled to two opposite portions of the semiconductor pattern OSP. In an embodiment, the stacking structure of the transistor TR may be variously changed, and the inventive concept is not limited to a specific structure of the transistor TR.

A third insulating layer 30 may be disposed on the second insulating layer 20 to cover the input electrode DE and the output electrode SE. The third insulating layer 30 may be formed of or include at least one of organic or inorganic materials and may have a single-layered or stacking structure.

A first electrode AE may be disposed on the third insulating layer 30. The first electrode AE may be provided to pass through the third insulating layer 30 and may be electrically connected to the transistor TR. FIG. 7A illustrates an example, in which the first electrode AE is separated from the transistor TR, but the first electrode AE may be connected to the transistor TR through a contact hole penetrating the third insulating layer 30.

A pixel definition layer PDL may be disposed on the third insulating layer 30. An opening OP may be defined in the pixel definition layer PDL to penetrate the pixel definition layer PDL. The opening OP may expose at least a portion of the first electrode AE. The pixel definition layer PDL may be formed of or include an organic material. The opening OP may correspond to a light-emitting region of the pixel PX.

The emission pattern EML may be disposed on the first electrode AE exposed by the opening OP. The emission pattern EML may include a light-emitting material. For example, the emission pattern EML may include at least one of materials capable of emitting red, green, or blue light. In an embodiment, the emission pattern EML may be formed of or include a fluorescent or phosphorescent material. The emission pattern EML may be formed of or include at least one of organic or inorganic light-emitting materials. The emission pattern EML may emit a light in response to a difference in electric potential between two electrodes (e.g., the first electrode AE and a second electrode CE) of the organic light emitting diode OLED.

The second electrode CE may be disposed on the emission pattern EML. In an embodiment, the second electrode CE may be formed of or include a transparent conductive material or a transflective conductive material. Thus, light generated by the emission pattern EML may easily pass through the second electrode CE and may propagate in the third direction D3. In an embodiment, the second electrode CE may be provided in common in a plurality of pixels.

However, the inventive concept is not limited to this example, and, in an embodiment, the organic light emitting diode OLED may be designed to have a back-side emission structure, in which the first electrode AE includes a transparent or transflective material, or a double-sided emission structure in which light is emitted through both of the front and rear surfaces thereof.

The organic light emitting diode OLED may include at least one of a hole control layer HCL, which is disposed between the first electrode AE and the emission pattern EML, and an electron control layer ECL, which is disposed between the emission pattern EML and the second electrode CE, but the inventive concept is not limited to this example or a specific embodiment.

The thin encapsulation layer TFE may cover the organic light emitting diode OLED. In the present embodiment, the thin encapsulation layer TFE may include a first inorganic layer LIL, an organic layer OEL, and a second inorganic layer UIL, which are sequentially stacked in the third direction DR3.

The first inorganic layer LIL may cover the second electrode CE. The first inorganic layer LIL may prevent or substantially prevent external moisture or oxygen from entering the organic light emitting diode OLED. In an embodiment, the first inorganic layer LIL may be formed of or include at least one of, for example, silicon nitride, silicon oxide, or compounds thereof. In an embodiment, the first inorganic layer LIL may be formed by a chemical vapor deposition process.

The organic layer OEL may be disposed on the first inorganic layer LIL to be in contact with the first inorganic layer LIL. The organic layer OEL on the first inorganic layer LIL may be provided to have a flat surface. The organic layer OEL may cover an uneven structure, particles, or the like, which are present on the first inorganic layer LIL, and, thus, it may be possible to prevent or substantially prevent elements, which are formed on the organic layer OEL, from being affected by a surface state of the top surface of the first inorganic layer LIL. In addition, the organic layer OEL may relieve a stress between layers in contact with each other. In an embodiment, the organic layer OEL may be formed of or include an organic material and may be formed by a solution process (e.g., spin coating, slit coating, and inkjet processes).

The second inorganic layer UIL may be disposed on the organic layer OEL to cover the organic layer OEL. Since the organic layer OEL has a relatively flat top surface, the second inorganic layer UIL may be more stably formed on the organic layer OEL, compared to a case in which the second inorganic layer UIL is directly formed on the first inorganic layer LIL. The second inorganic layer UIL may encapsulate the organic layer OEL and may prevent or substantially prevent moisture from being leaked from the organic layer OEL to the outside. In an embodiment, the second inorganic layer UIL may be formed of or include at least one of, for example, silicon nitride, silicon oxide, or compounds thereof. In an embodiment, the second inorganic layer UIL may be formed by a chemical vapor deposition process.

In the present embodiment, a structure from the buffer layer BFL to the third insulating layer 30 may be defined as the circuit device layer DP-CL shown in FIG. 5B, and a structure including the pixel definition layer PDL and the organic light emitting diode OLED may be defined as the display device layer DP-OLED.

In the present embodiment, the first and second inorganic layers LIL and UIL of the thin encapsulation layer TFE may be extended from the non-bending region NBA to the bending region BA. In an embodiment, for example, the first and second inorganic layers LIL and UIL may be provided to cover the entire top surface of the base substrate SUB.

In an embodiment, the display apparatus DD may include a groove BR, which is overlapped with the bending region BA and is provided to penetrate some elements of the display apparatus DD. In an embodiment, for example, the groove BR may be provided to penetrate the display device layer DP-OLED and the circuit device layer DP-CL and to expose a portion of the base substrate SUB.

The groove BR may have an inner surface BR-I which is covered with the first inorganic layer LIL. The groove BR with the first inorganic layer LIL may be filled with the organic layer OEL of the thin encapsulation layer TFE.

Referring to FIG. 7B, the groove BR according to an embodiment may include a first hole GH1 penetrating the insulating layers BFL, 10, 20, and 30 of the circuit device layer DP-CL. In addition, the groove BR may further include a second hole GH2, which is overlapped with the first hole GH1 and is provided to penetrate the pixel definition layer PDL and the first electrode AE of the display device layer DP-OLED.

In an embodiment, the first hole GH1 and the second hole GH2 may have different widths from each other in a specific direction. For example, in the specific direction, a minimum width W2 of the second hole GH2 may be smaller than a minimum width W1 of the first hole GH1. In this case, the groove BR may have an under-cut structure.

In an embodiment, the under-cut structure may be caused by a difference in etch rate between the insulating layers BFL, 10, 20, and 30 of the circuit device layer DP-CL and the pixel definition layer PDL and the first electrode AE of the display device layer DP-OLED.

In the present embodiment, the pixel definition layer PDL and the first electrode AE near the first hole GH1 may be defined as a tip portion TP. According to an embodiment of the inventive concept, since the tip portion TP is covered with one of the inorganic layers LIL and UIL of the thin encapsulation layer TFE and the inner surface BR-I of the groove BR is covered with the organic layer OEL of the thin encapsulation layer TFE, it may be possible to improve the structural stability of the groove BR.

The groove BR of FIG. 7A and grooves to be described below may be configured to have substantially the same features as the groove described with reference to FIGS. 8A to 8E. Each of the grooves of FIGS. 8A to 8E may have the inner surface BR-I, which is covered with one of the inorganic layers LIL and UIL of the thin encapsulation layer TFE. Each of FIGS. 8A to 8E illustrates a shape of the groove BR of FIG. 7A, for example, when viewed in a plan view.

Figure 8A:
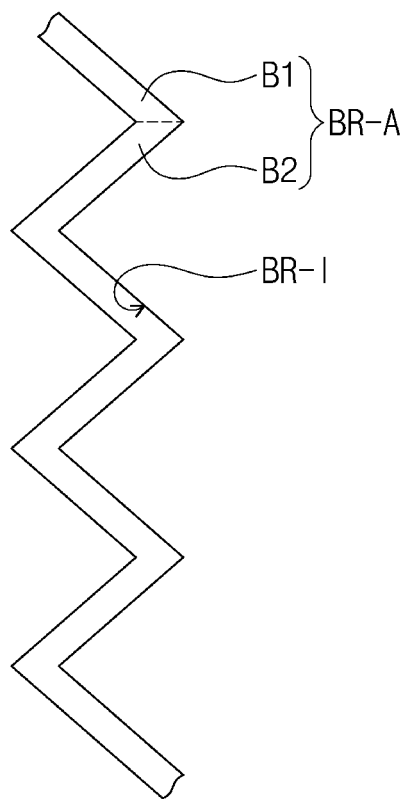
FIGS. 8A to 8E are plan views illustrating a groove according to some embodiments of the inventive concept.

Referring to FIG. 8A, a groove BR-A according to an embodiment may include a first pattern B1 and a second pattern B2, which are linearly extended in two different directions. In an embodiment, the first pattern B1 and the second pattern B2 may be alternately arranged and may be connected to each other. For example, the groove BR-A may be provided to have a zigzag shape.

Figure 8B:
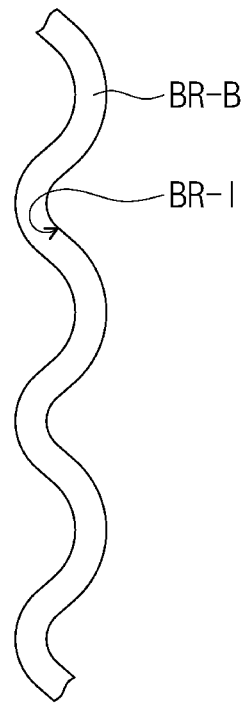

Referring to FIG. 8B, a groove BR-B according to an embodiment may be extended to form a curved pattern or a sinusoidal wave pattern in a specific direction. For example, the groove BR-B may include a convex portion and a concave portion, when viewed based on a side surface thereof.

Figure 8C:
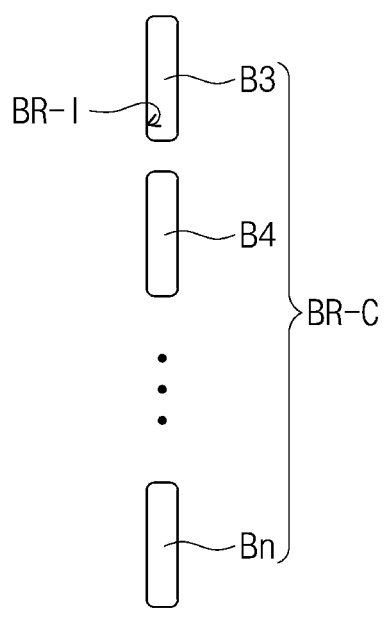

Referring to FIG. 8C, a groove BR-C according to an embodiment may include a plurality of groove patterns B3, B4, and Bn, which are spaced apart from each other in a specific direction. The circuit device layer DP-CL and the display device layer DP-OLED may be disposed between the groove patterns B3, B4, and Bn. In other words, the circuit device layer DP-CL and the display device layer DP-OLED, which are not pierced by the groove patterns B3, B4, and Bn, may remain between the groove patterns B3, B4, and Bn.

Figure 8D:
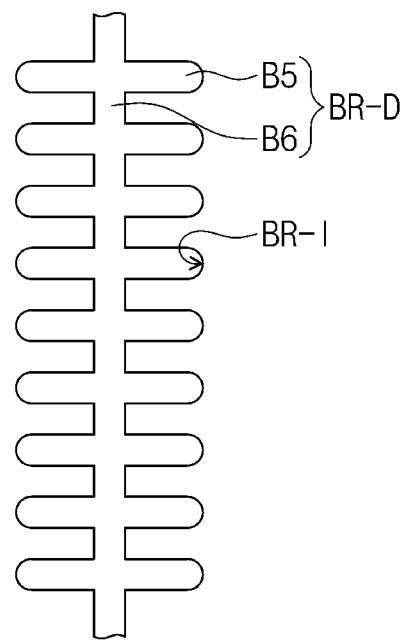

Referring to FIG. 8D, a groove BR-D according to an embodiment may include a plurality of extension patterns B5 and a plurality of connection patterns B6. The extension patterns B5 may be extended in a specific direction and may be arranged to be spaced apart from each other in a direction crossing the specific direction. The connection patterns B6 may be disposed between the extension patterns B5 to connect the extension patterns B5 to each other.

Figure 8E:
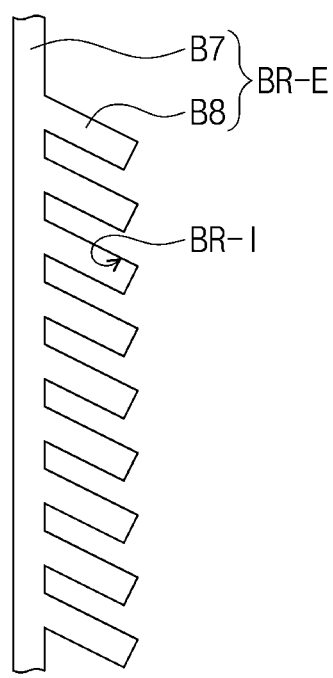

Referring to FIG. 8E, a groove BR-E according to an embodiment may include a center pattern B7 and branch patterns B8. The center pattern B7 may be extended in a specific direction. The branch patterns B8 may be extended in a direction oblique to the specific direction and may be arranged to be spaced apart from each other in the specific direction. The branch patterns B8 may be connected to the center pattern B7.

According to some embodiments of the inventive concept, since the groove BR, which is overlapped with the bending region BA, is provided to have one of the shapes described with reference to FIGS. 8A to 8E, it may be possible to relieve a stress which may be caused when the display apparatus is bent. Accordingly, the display apparatus DD with improved bending durability may be provided.

In an embodiment, a liquid organic material may be supplied to form the organic layer OEL of the thin encapsulation layer TFE, and, during this process, the groove BR may delimit a spread boundary of the liquid organic material to be spread. For example, the thin encapsulation layer TFE may be formed by coating the first inorganic layer LIL with a liquid organic material using an inkjet method, and, in this case, the groove BR may delimit a boundary of a region to be coated with the liquid organic material and may prevent or substantially prevent the liquid organic material from being overflown to the outside of the groove BR.

Figure 9A:
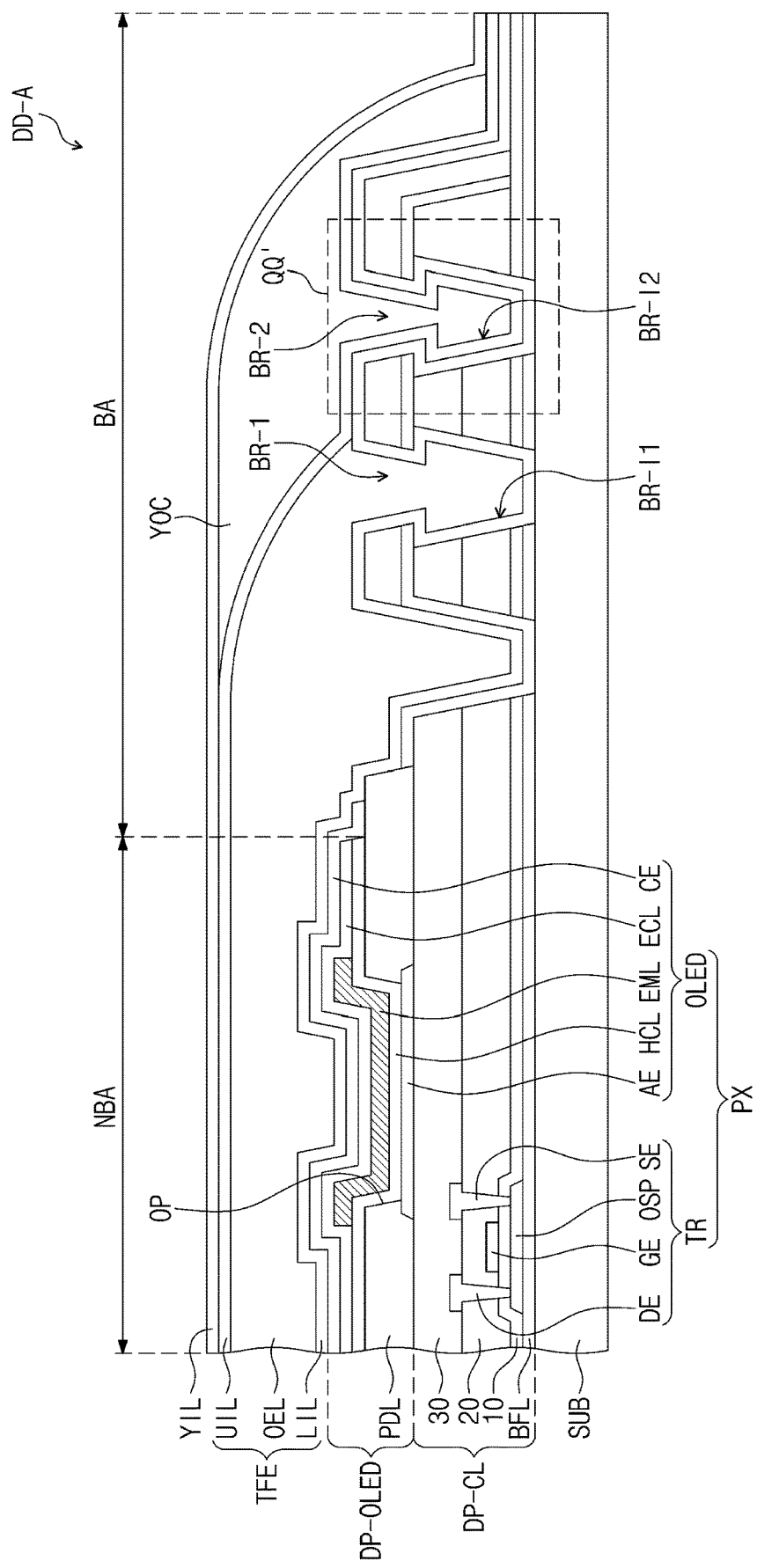
FIG. 9A is a cross-sectional view illustrating a display apparatus according to an embodiment of the inventive concept.
Figure 9B:
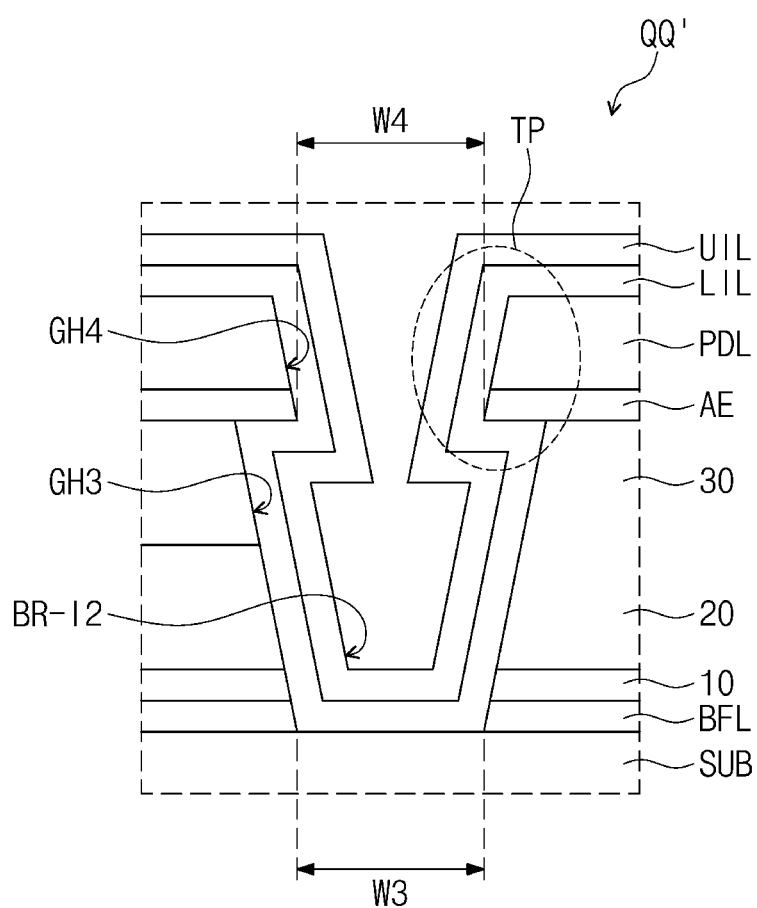
FIG. 9B is an enlarged cross-sectional view of a region QQ' of FIG. 9A.
Figure 10:
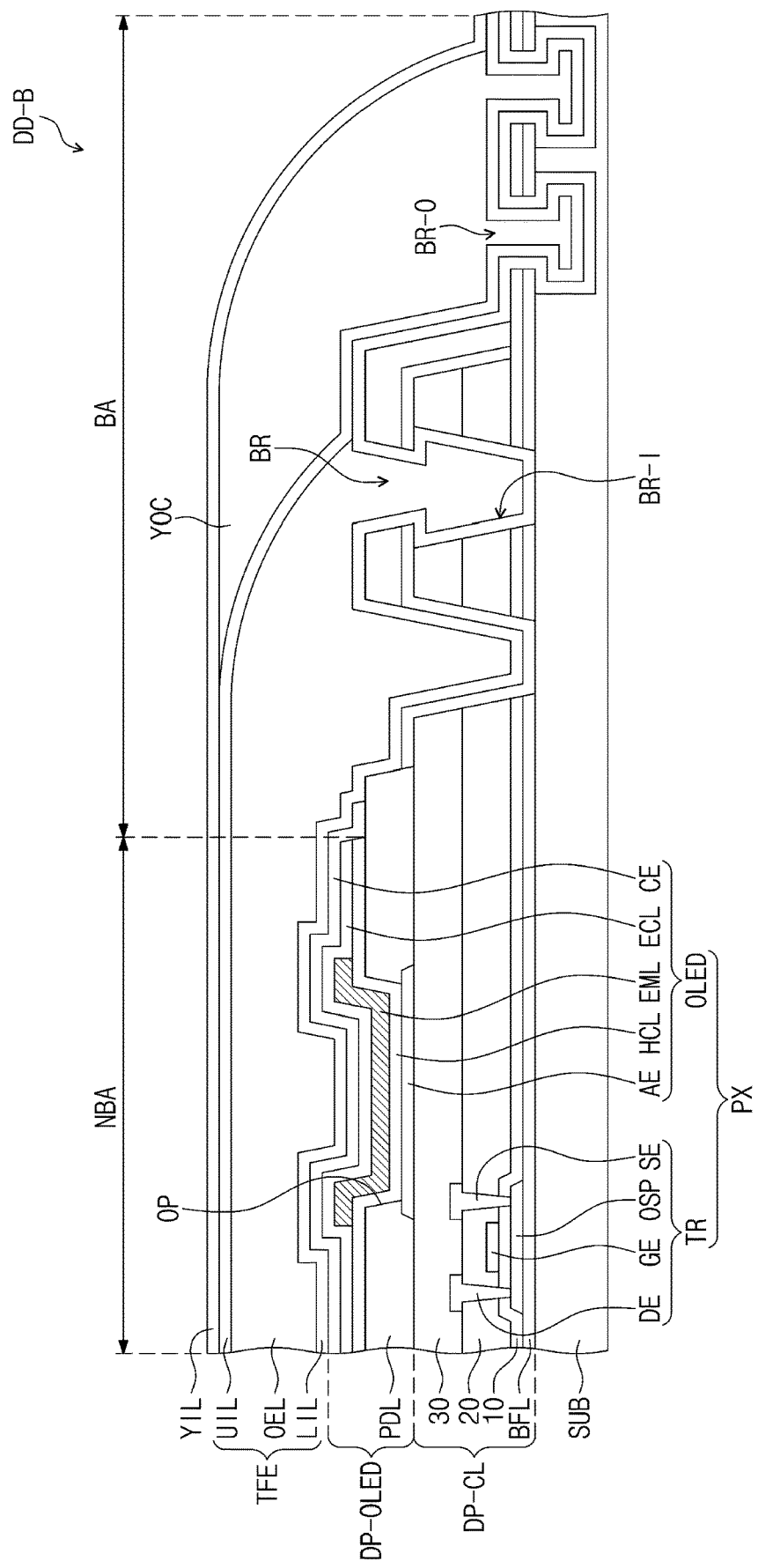
FIG. 10 is a cross-sectional view illustrating a display apparatus according to an embodiment of the inventive concept.
Figure 11:
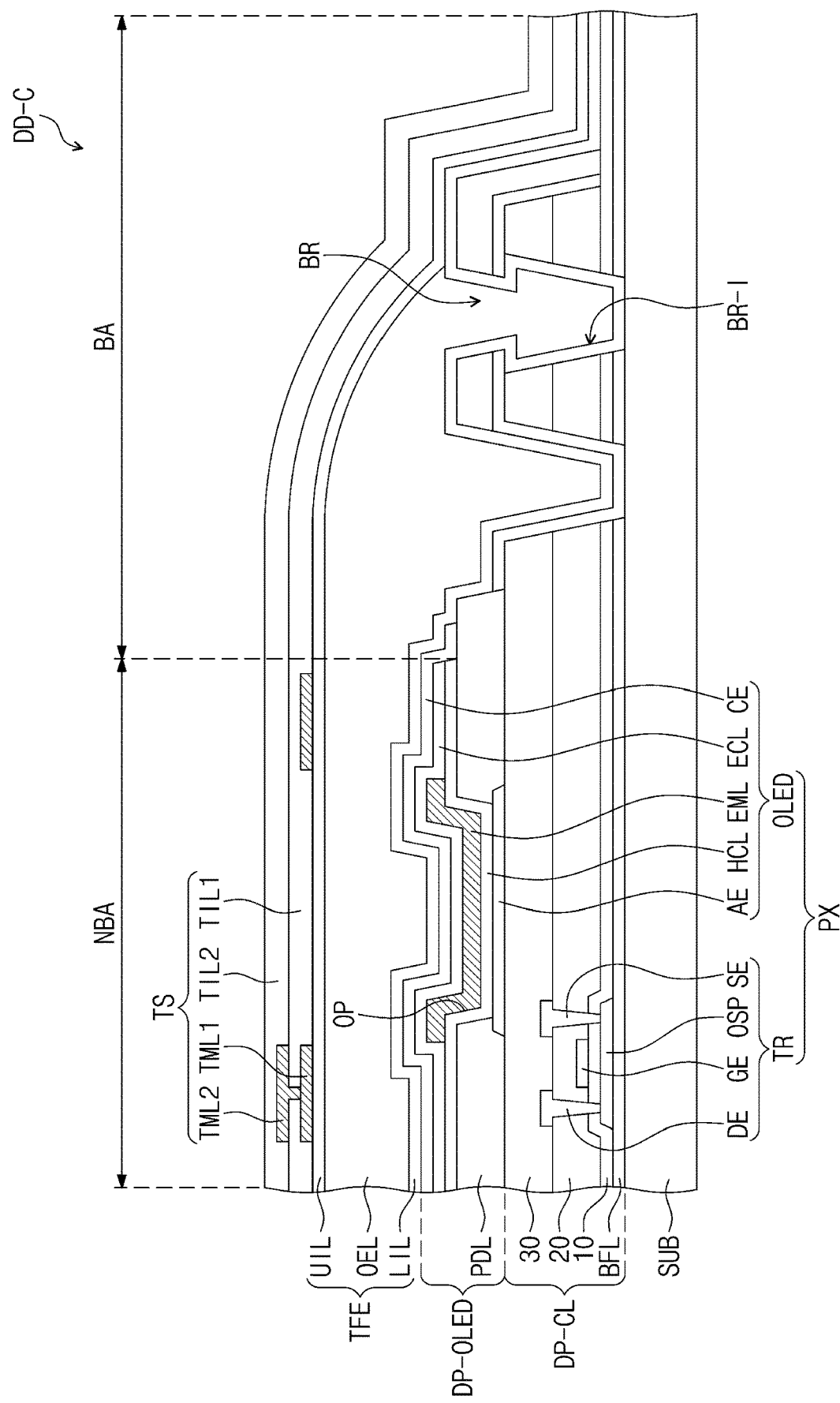
FIG. 11 is a cross-sectional view illustrating a display apparatus according to an embodiment of the inventive concept.

FIG. 9A is a cross-sectional view illustrating a display apparatus according to an embodiment of the inventive concept; and FIG. 9B is an enlarged cross-sectional view of a region QQ' of FIG. 9A. FIG. 10 is a cross-sectional view illustrating a display apparatus according to an embodiment of the inventive concept. FIG. 11 is a cross-sectional view illustrating a display apparatus according to an embodiment of the inventive concept. For concise description, an element previously described with reference to FIGS. 1 to 8E may be identified by the same reference numeral without repeating an overlapping description thereof.

In some embodiments, a display apparatus DD-A, DD-B, or DD-C may include the base substrate SUB including the bending region BA and the non-bending region NBA, the circuit device layer DP-CL, the display device layer DP-OLED, the thin encapsulation layer TFE, the pixel PX, and at least one groove on the bending region BA.

The circuit device layer DP-CL may include the plurality of insulating layers BFL, 10, 20, and 30, and the transistor TR, and the transistor TR may include the semiconductor pattern OSP, the control electrode GE, the input electrode DE, and the output electrode SE, which are provided between the insulating layers BFL, 10, 20, and 30. The display device layer DP-OLED may include the pixel definition layer PDL, in which the opening OP is defined, and the organic light emitting diode OLED, which includes the first electrode AE, the hole control layer HCL, the emission pattern EML, the electron control layer ECL, and the second electrode CE. The thin encapsulation layer TFE may include the first inorganic layer LIL, the organic layer OEL, and the second inorganic layer UIL, which are sequentially stacked.

Referring to FIG. 9A, the display apparatus DD-A according to an embodiment may include a plurality of grooves BR-1 and BR-2, which are provided on the bending region BA.

The groove BR-1 and an inner surface BR-I1 of the groove BR-1 may be elements corresponding to the groove BR and the inner surface BR-I of the groove BR described with reference to FIGS. 7A and 7B. The additional groove BR-2 according to the present embodiment may be spaced farther apart from the non-bending region NBA than the groove BR-1. The additional groove BR-2 may be provided to penetrate not only the display device layer DP-OLED but also the circuit device layer DP-CL and to expose a portion of the base substrate SUB.

The additional groove BR may have an inner surface BR-I2, which is sequentially covered with the first and second inorganic layers LIL and UIL.

Referring to FIG. 9B, the additional groove BR-2 may include a third hole GH3 penetrating the insulating layers BFL, 10, 20, and 30 of the circuit device layer DP-CL. In addition, the additional groove BR-2 may further include a fourth hole GH4, which is overlapped with the third hole GH3 and is provided to penetrate the pixel definition layer PDL and the first electrode AE of the display device layer DP-OLED.

In an embodiment, the third hole GH3 and the fourth hole GH4 may have different widths from each other in a specific direction. For example, in the specific direction, a minimum width W4 of the fourth hole GH4 may be smaller than a minimum width W3 of the third hole GH3. In this case, the additional groove BR-2 may have an under-cut structure.

In an embodiment, the under-cut structure may be caused by a difference in etch rate between the insulating layers BFL, 10, 20, and 30 of the circuit device layer DP-CL and the pixel definition layer PDL and the first electrode AE of the display device layer DP-OLED.

In the present embodiment, the pixel definition layer PDL and the first electrode AE near the third hole GH3 may be defined as a tip portion TP. In an embodiment, the tip portion TP may be covered with the inorganic layers LIL and UIL of the thin encapsulation layer TFE.

Referring back to FIG. 9A, the display apparatus DD-A according to the present embodiment may further include a planarization layer YOC covering the additional groove BR-2 and a conformal inorganic layer YIL covering the planarization layer YOC and the thin encapsulation layer TFE. The inner surface BR-I2 of the additional groove BR-2 may be covered with the planarization layer YOC.

Accordingly, it may be possible to realize a robust structure of the additional groove BR-2.

In addition, each of the groove BR-1 and the additional groove BR-2 may have a same shape as one of FIGS. 8A to 8E, when viewed in a plan view. Here, the groove BR-1 and the additional groove BR-2 may have the same shape or may have different shapes from each other, but the inventive concept is not limited to this example or a specific embodiment.

According to one or more embodiments of the inventive concept, since the grooves BR-1 and BR-2 overlapped with the bending region BA are provided, it may be possible to relieve a stress, which may be caused when the display apparatus DD-A is bent. Accordingly, the display apparatus DD-A with improved bending durability may be provided.

Referring to FIG. 10, the display apparatus DD-B according to an embodiment may include a plurality of grooves BR and BR-O provided in the bending region BA.

The groove BR and the inner surface BR-I of the groove BR may be elements corresponding to the groove BR and the inner surface BR-I of the groove BR described with reference to FIGS. 7A and 7B. The auxiliary grooves BR-O according to the present embodiment may be spaced farther apart from the non-bending region NBA than the groove BR. The auxiliary grooves BR-O may be formed by removing not only the display device layer DP-OLED and the circuit device layer DP-CL, but also a portion of the base substrate SUB.

The auxiliary grooves BR-O may have an inner surface which is sequentially covered with the first and second inorganic layers LIL and UIL. In an embodiment, the auxiliary grooves BR-O may also have an under-cut structure which is formed by a difference in etch rate between elements of the circuit device layer DP-CL and the base substrate SUB that are etched in the process of forming the auxiliary grooves BR-O.

The display apparatus DD-B according to the present embodiment may further include a planarization layer YOC covering the auxiliary grooves BR-O and a conformal inorganic layer YIL covering the planarization layer YOC and the thin encapsulation layer TFE. The inner surface of the auxiliary grooves BR-O may be covered with the planarization layer YOC. Accordingly, it may be possible to realize a robust structure of the auxiliary grooves BR-O.

According to one or more embodiments of the inventive concept, since the grooves BR and BR-O overlapped with the bending region BA are provided, it may be possible to relieve a stress, which may be caused when the display apparatus DD-B is bent. In addition, it may be possible to prevent or substantially prevent moisture and oxygen from entering the organic light emitting diode OLED through or from the bending region BA and thereby to improve reliability of the organic light emitting diode OLED.

FIG. 10 illustrates an example, in which a plurality of the auxiliary grooves BR-O are provided, but in certain embodiments, a single auxiliary groove or two or more auxiliary grooves may be provided in the display apparatus. However, the inventive concept is not limited to these examples.

Referring to FIG. 11, the display apparatus DD-C according to an embodiment may include a sensing sensor TS, which is directly disposed on the thin encapsulation layer TFE. The sensing sensor TS may be an element corresponding to the sensing sensor TS described with reference to FIG. 2.

In an embodiment, the sensing sensor TS may include a plurality of conductive patterns TML1 and TML2, a plurality of sensing insulating layers TIL1 and TIL2, and sensing signal lines (not shown). The sensing signal lines may be disposed in the bending region BA, may be extended to the non-bending region NBA, and may be connected to the conductive patterns TML1 and TML2.

In an embodiment, a first sensing pattern TML1, which is one of the conductive patterns TML1 and TML2, may be directly disposed on the thin encapsulation layer TFE. In an embodiment, the first sensing pattern TML1 may be an element, which is formed on the thin encapsulation layer TFE, without an additional adhesive layer, in a successive manner.

A first sensing insulating layer TIL1, which is one of the sensing insulating layers TIL1 and TIL2, may cover the first sensing pattern TML1. The first sensing insulating layer TIL1 may be formed of or include at least one of inorganic or organic materials.

A second sensing pattern TML2, which is one of the conductive patterns TML1 and TML2, may be disposed on the first sensing insulating layer TIL1. Thus, the first and second sensing patterns TML1 and TML2 may be disposed on different layers, and the first sensing insulating layer TIL1 may be interposed between the first and second sensing patterns TML1 and TML2. A portion of the second sensing pattern TML2 may be provided to penetrate the first sensing insulating layer TIL1 and may be connected to the first sensing pattern TML1.

A second sensing insulating layer TIL2, which is one of the sensing insulating layers TIL1 and TIL2, may cover the second sensing pattern TML2. The second sensing insulating layer TIL2 may be formed of or include at least one of inorganic or organic materials.

The sensing patterns TML1 and TML2 may be portions of sensing electrodes, which are spaced apart from each other and are used to sense an external input in a capacitance sensing manner. The sensing patterns TML1 and TML2 may be disposed to be spaced apart from the opening OP of the pixel definition layer PDL.

Figure 12:
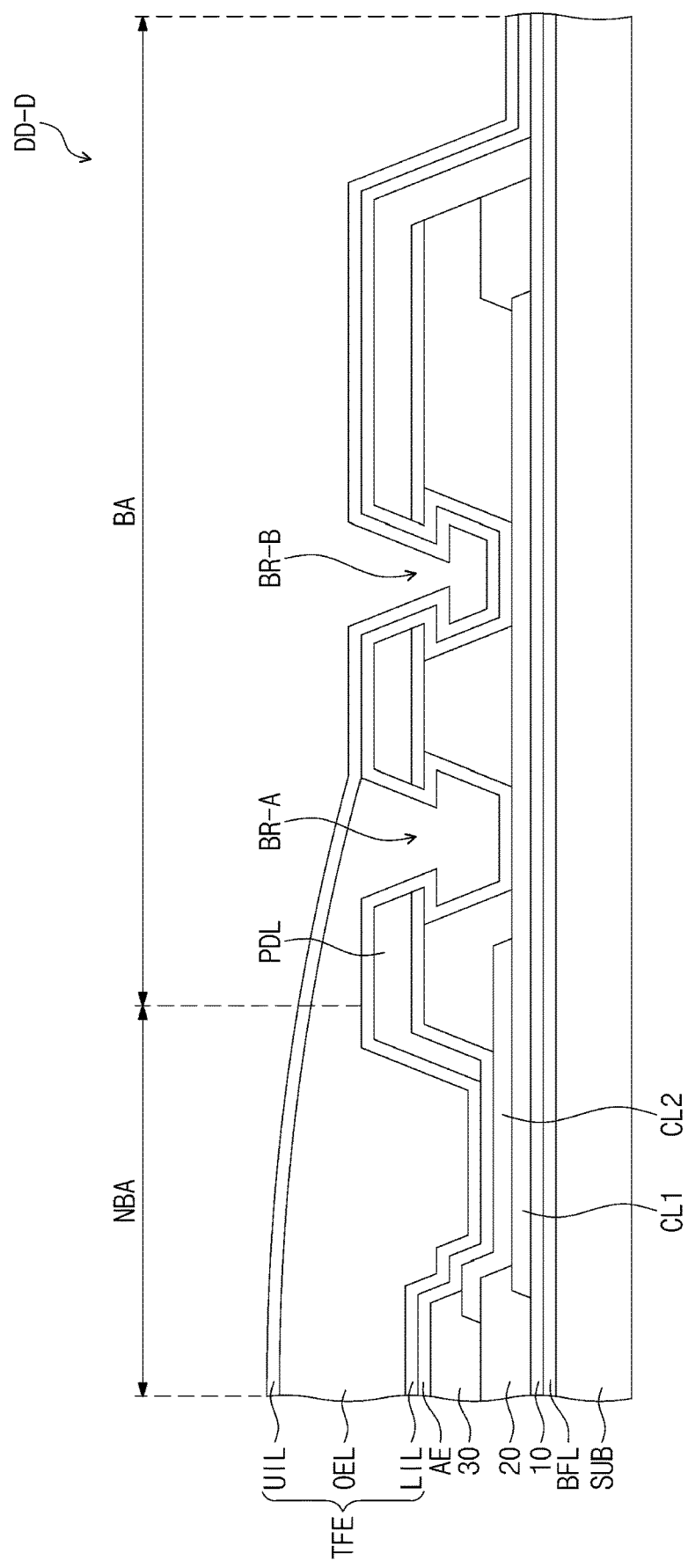
FIG. 12 is a cross-sectional view illustrating a display apparatus according to an embodiment of the inventive concept.
Figure 13:
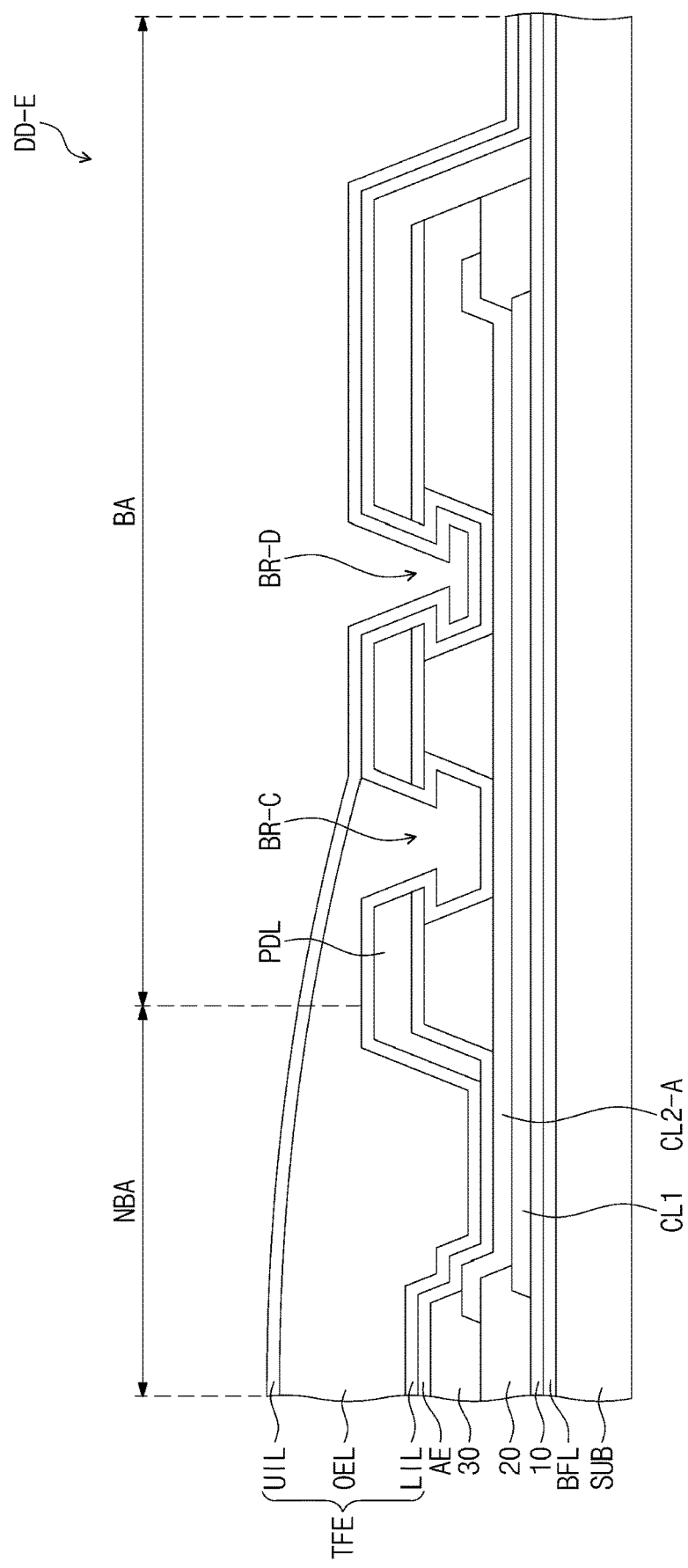
FIG. 13 is a cross-sectional view illustrating a display apparatus according to an embodiment of the inventive concept.
Figure 14:
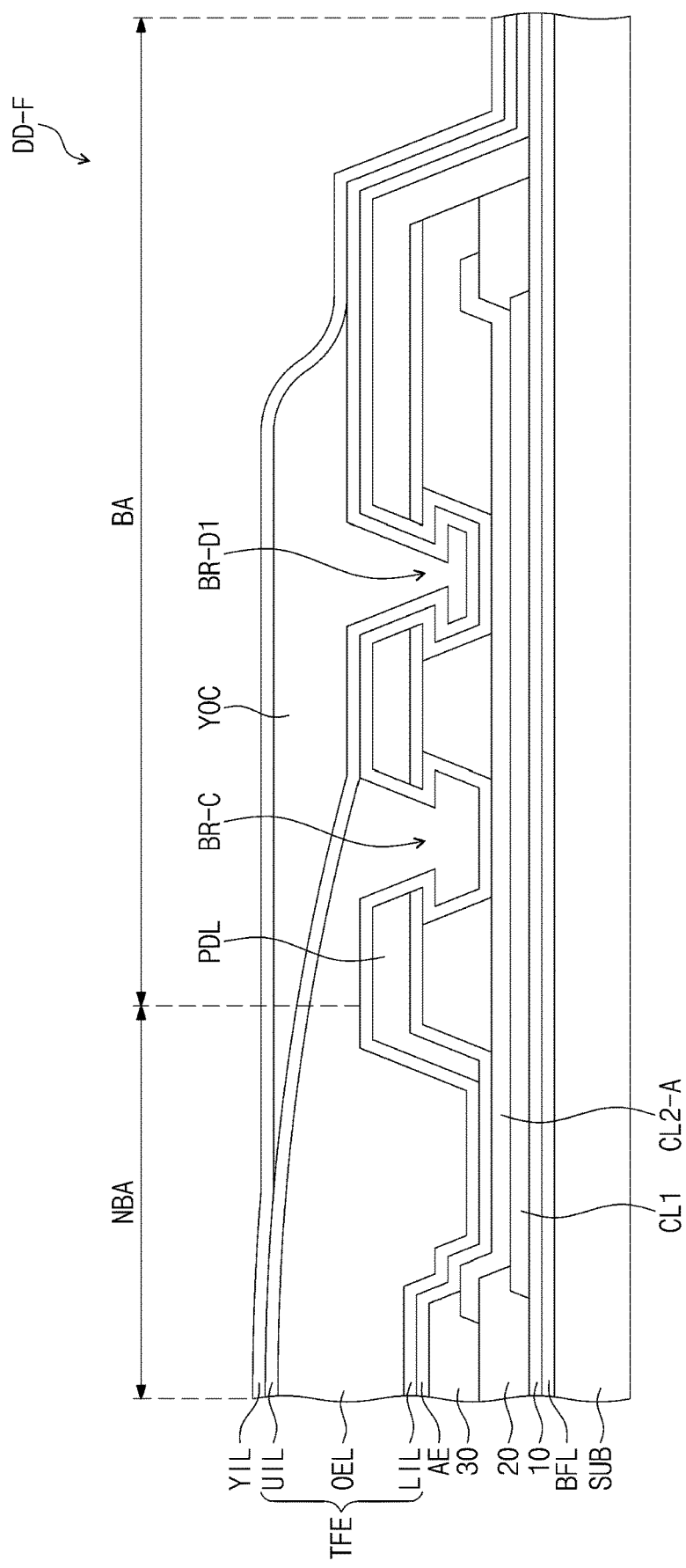
FIG. 14 is a cross-sectional view illustrating a display apparatus according to an embodiment of the inventive concept.

FIG. 12 is a cross-sectional view illustrating a display apparatus according to an embodiment of the inventive concept. FIG. 13 is a cross-sectional view illustrating a display apparatus according to an embodiment of the inventive concept. FIG. 14 is a cross-sectional view illustrating a display apparatus according to an embodiment of the inventive concept. For concise description, an element previously described with reference to FIGS. 1 to 8E may be identified by the same reference numeral without repeating an overlapping description thereof.

Referring to FIG. 12, a display apparatus DD-D according to an embodiment of the inventive concept may include grooves BR-A and BR-B, which are overlapped with one of additional electrodes CL1 and CL2 extending from the non-bending region NBA to the bending region BA.

A first additional electrode CL1, which is one of the additional electrodes CL1 and CL2, may be disposed on the first insulating layer 10. A second additional electrode CL2, which is one of the additional electrodes CL1 and CL2, may be disposed on the first additional electrode CL1 and may be in contact with the first additional electrode CL1. In addition, the second additional electrode CL2 may expose a portion of the first additional electrode CL1. The additional electrodes CL1 and CL2 may be used to deliver the second voltage ELVSS described with reference to FIG. 6. Further, although not shown, an end portion of at least one of the additional electrodes CL1 and CL2 may be connected to the storage capacitor Cst.

In the present embodiment, the grooves BR-A and BR-B may be overlapped with the first additional electrode CL1 and may be spaced apart from the second additional electrode CL2. For example, each of the grooves BR-A and BR-B may be provided to penetrate the pixel definition layer PDL, the first electrode AE, the third insulating layer 30, and the second insulating layer 20, and to expose a portion of the first additional electrode CL1. In an embodiment, the grooves BR-A and BR-B may not penetrate the insulating layers BFL and 10, which are disposed below the first additional electrode CL1, when the grooves BR-A and BR-B are formed, and may be extended from the non-bending region NBA to the bending region BA.

However, the inventive concept is not limited to this example or a specific embodiment. For example, in an embodiment, the second additional electrode CL2 may be extended to and overlapped with the first groove BR-A or may be omitted.

The first groove BR-A may be closer to the non-bending region NBA than the second groove BR-B. The first groove BR-A may have an inner surface covered with the first inorganic layer LIL of the thin encapsulation layer TFE. The second groove BR-B may have an inner surface covered with the first and second inorganic layers LIL and UIL of the thin encapsulation layer TFE.

In the present embodiment, the inner surface of the first groove BR-A may be covered with the organic layer OEL of the thin encapsulation layer TFE, and, thus, it may be possible to realize a robust structure of the groove BR-A.

Referring to FIG. 13, a display apparatus DD-E according to an embodiment of the inventive concept may include grooves BR-C and BR-D, which are overlapped with additional electrodes CL1 and CL2-A extending from the non-bending region NBA to the bending region BA.

The first additional electrode CL1 may be disposed on the first insulating layer 10. The second additional electrode CL2-A may be disposed on the first additional electrode CL1 and may be in contact with the first additional electrode CL1. The additional electrodes CL1 and CL2-A may be used to deliver the second voltage ELVSS described with reference to FIG. 6. In addition, an end portion of at least one of the additional electrodes CL1 and CL2-A may be connected to the storage capacitor Cst.

In the present embodiment, the grooves BR-C and BR-D may be overlapped with the additional electrodes CL1 and CL2. For example, the grooves BR-C and BR-D may be provided to penetrate the pixel definition layer PDL, the first electrode AE, the third insulating layer 30, and the second insulating layer 20, and to expose a portion of the second additional electrode CL2-A. In an embodiment, the grooves BR-C and BR-D may not penetrate the insulating layers BFL and 10, which are disposed below the second additional electrode CL2-A, when the grooves BR-C and BR-D are formed, and may be extended from the non-bending region NBA to the bending region BA.

The first groove BR-C may be closer to the non-bending region NBA than the second groove BR-D. The first groove BR-C may have an inner surface covered with the first inorganic layer LIL of the thin encapsulation layer TFE. The second groove BR-D may have an inner surface covered with the first and second inorganic layers LIL and UIL of the thin encapsulation layer TFE.

In the present embodiment, the inner surface of the first groove BR-C may be covered with the organic layer OEL of the thin encapsulation layer TFE, and, thus, it may be possible to realize a robust structure of the groove BR-C.

Referring to FIG. 14, a display apparatus DD-F according to an embodiment of the inventive concept may include grooves BR-C and BR-D1, which are overlapped with additional electrodes CL1 and CL2-A extending from the non-bending region NBA to the bending region BA.

In an embodiment, the display apparatus DD-F may further include a planarization layer YOC covering an inner surface of the second groove BR-D1 and a conformal inorganic layer YIL covering the planarization layer YOC and the thin encapsulation layer TFE. The inner surface of the second groove BR-D1 may be covered with the planarization layer YOC. Accordingly, it may be possible to realize a robust structure of the second groove BR-D1.

In the present embodiment, the grooves BR-C and BR-D1 are illustrated to be overlapped with each of the additional electrodes CL1 and CL2-A, but the inventive concept is not limited to this example or a specific embodiment. For example, the first additional electrode CL1 may be spaced apart from the second groove BR-D1 and may be overlapped with only the first groove BR-C, and, in certain embodiments, the second additional electrode CL2-A may be omitted.

According to one or more embodiments of the inventive concept, a display apparatus may include grooves, which are overlapped with a bending region, and, in this case, the grooves may relieve a stress which may be caused when the display apparatus is bent. Accordingly, a display apparatus with improved bending durability may be provided.

While some example embodiments of the inventive concepts have been particularly shown and described, it will be understood by one of ordinary skill in the art that variations in form and detail may be made therein without departing from the spirit and scope of the attached claims.

What is claimed is:
1. A display apparatus, comprising:
 a base substrate comprising a bending region and a non-bending region adjacent to the bending region and having a flexible property;
 a circuit device layer on the base substrate, the circuit device layer comprising a thin film transistor;
 a display device layer on the circuit device layer, the display device layer comprising an organic light emitting diode connected to the thin film transistor;
 an encapsulation layer covering the display device layer and comprising a first inorganic layer, an organic layer, and a second inorganic layer, which are sequentially stacked; and
 a groove overlapped with the bending region, the groove penetrating the display device layer and the circuit device layer,
 wherein at least one of the first inorganic layer and the second inorganic layer covers the groove, and
 wherein the groove has an under-cut structure.
2. The display apparatus of claim 1, wherein the groove has a structure in which patterns extending in two different direction are alternately arranged.
3. The display apparatus of claim 1, wherein the groove extends to define a curved pattern or a sinusoidal wave pattern in a direction.
4. The display apparatus of claim 1, wherein the groove comprises a plurality of extension patterns which extend in a first direction and are arranged in a direction crossing the first direction, and connection patterns which are between the extension patterns.
5. The display apparatus of claim 1, wherein the groove comprises a central pattern which extends in a first direction, and branch patterns which extend from the central pattern in a direction oblique to the first direction and are spaced apart from each other in the first direction.
6. The display apparatus of claim 1, further comprising another groove which is spaced farther apart from the non-bending region than the groove and penetrates the display device layer and the circuit device layer,
 wherein the another groove is sequentially covered with the first inorganic layer and the second inorganic layer.
7. The display apparatus of claim 6, further comprising a planarization layer which fills the another groove, an inner surface of the another groove being enclosed by the second inorganic layer, and the planarization layer, together with the encapsulation layer, providing a flat surface.
8. The display apparatus of claim 1, further comprising an auxiliary groove which is spaced farther apart from the non-bending region than the groove and penetrates the display device layer and a portion of the base substrate,
 wherein the auxiliary groove is sequentially covered with the first inorganic layer and the second inorganic layer.
9. A display apparatus, comprising:
 a base substrate comprising a bending region and a non-bending region adjacent to the bending region and having a flexible property;
 a circuit device layer on the base substrate, the circuit device layer comprising a thin film transistor;
 a display device layer on the circuit device layer, the display device layer comprising an organic light emitting diode connected to the thin film transistor;

an encapsulation layer covering the display device layer and comprising a first inorganic layer, an organic layer, and a second inorganic layer, which are sequentially stacked; and a groove overlapped with the bending region, the groove penetrating the display device layer and the circuit device layer, wherein at least one of the first inorganic layer and the second inorganic layer covers the groove, wherein the groove comprises a plurality of groove patterns which are spaced apart from each other in a direction, and wherein the circuit device layer and the display device layer are between the groove patterns.

10. A display apparatus, comprising:

a base substrate comprising a bending region and a non-bending region adjacent to the bending region and having a flexible property;

a circuit device layer on the base substrate, the circuit device layer comprising a thin film transistor, a plurality of insulating layers, and a first hole penetrating the insulating layers overlapped with the bending region;

a display device layer on the circuit device layer, the display device layer comprising a first electrode, a second electrode on the first electrode, an emission pattern between the first electrode and the second electrode, a pixel definition layer comprising an opening exposing at least a portion of the first electrode, and a second hole overlapped with the first hole to penetrate the pixel definition layer and the first electrode; and an encapsulation layer covering the display device layer, the encapsulation layer comprising a first inorganic layer, an organic layer, and a second inorganic layer, which are sequentially stacked, wherein at least one of the first and second inorganic layers covers the first hole and the second hole, and wherein the second hole has a minimum width which is smaller than a minimum width of the first hole, and has an under-cut structure.

11. The display apparatus of claim 10, wherein the under-cut structure has a structure in which patterns extending in two different direction are alternately arranged.

12. The display apparatus of claim 10, wherein the under-cut structure extends to define a curved pattern or a sinusoidal wave pattern in a direction.

13. The display apparatus of claim 10, wherein the under-cut structure comprises a plurality of patterns which are spaced apart from each other in a direction, and the circuit device layer and the display device layer are between the patterns.

14. The display apparatus of claim 10, wherein the under-cut structure comprises a plurality of extension patterns which extend in a first direction and are arranged in a direction crossing the first direction, and connection patterns which are between the extension patterns.

15. The display apparatus of claim 10, wherein the under-cut structure comprises a central pattern which extends in a first direction, and branch patterns which extend from the central pattern in a direction oblique to the first direction and are spaced apart from each other in the first direction.

16. The display apparatus of claim 10, wherein the circuit device layer further comprises a third hole, which is spaced farther apart from the non-bending region than the first hole and penetrates the plurality of insulating layers, the display device layer further comprises a fourth hole, which is overlapped with the third hole and penetrates the pixel definition layer and the first electrode, and the third hole and the fourth hole are sequentially covered with the first inorganic layer and the second inorganic layer.

17. The display apparatus of claim 16, wherein the fourth hole has a minimum width which is smaller than a minimum width of the third hole, and has an under-cut structure.

18. The display apparatus of claim 10, further comprising an auxiliary hole which is spaced farther apart from the non-bending region than the first hole and the second hole and penetrates the display device layer and a portion of the base substrate, wherein the auxiliary hole is sequentially covered with the first inorganic layer and the second inorganic layer.

* * * * *